(12) United States Patent
Tamaki et al.

(10) Patent No.: US 7,755,896 B2
(45) Date of Patent: Jul. 13, 2010

(54) INFORMATION PROCESSING DEVICE

(75) Inventors: Yuuta Tamaki, Chiba (JP); Keiichi Aoki, Tokyo (JP)

(73) Assignee: Sony Computer Entertainment Inc., Tokyo (JP)

(*) Notice: Subject to any disclaimer, the term of this patent is extended or adjusted under 35 U.S.C. 154(b) by 130 days.

(21) Appl. No.: 11/857,514

(22) Filed: Sep. 19, 2007

(65) Prior Publication Data

US 2008/0074839 A1 Mar. 27, 2008

(30) Foreign Application Priority Data

Sep. 21, 2006 (JP) ............................. 2006-256428

(51) Int. Cl.
*H05K 7/20* (2006.01)
*H05K 5/00* (2006.01)
*G06F 1/20* (2006.01)
*H01L 23/495* (2006.01)
*F28F 7/00* (2006.01)

(52) U.S. Cl. ............. 361/704; 361/679.46; 361/679.54; 361/718; 361/719; 165/80.2; 257/675

(58) Field of Classification Search ................ 361/687, 361/679.46, 679.54, 718–719, 704; 165/80.2; 257/675
See application file for complete search history.

(56) References Cited

U.S. PATENT DOCUMENTS

| | | | | | |
|---|---|---|---|---|---|
| 4,599,680 | A | * | 7/1986 | Gibson et al. ............ | 361/679.31 |
| 5,237,486 | A | * | 8/1993 | LaPointe et al. ........ | 361/679.27 |
| 5,262,925 | A | * | 11/1993 | Matta et al. ............. | 361/783 |
| 5,373,099 | A | * | 12/1994 | Boitard et al. ........... | 174/16.3 |
| 5,459,639 | A | * | 10/1995 | Izumi ..................... | 361/707 |
| 5,552,967 | A | * | 9/1996 | Seto et al. .............. | 361/818 |
| 5,784,256 | A | * | 7/1998 | Nakamura et al. ....... | 361/699 |
| 5,880,930 | A | * | 3/1999 | Wheaton ................. | 361/690 |
| 6,151,214 | A | * | 11/2000 | Yeh ........................ | 361/695 |
| 6,157,538 | A | * | 12/2000 | Ali et al. ................. | 361/704 |
| 6,205,027 | B1 | * | 3/2001 | Nakajima ................ | 361/719 |
| 6,212,074 | B1 | * | 4/2001 | Gonsalves et al. ....... | 361/717 |
| 6,252,768 | B1 | * | 6/2001 | Lin ......................... | 361/679.34 |
| 6,317,319 | B1 | * | 11/2001 | Lewis et al. ............. | 361/695 |

(Continued)

FOREIGN PATENT DOCUMENTS

JP 2000-20172 1/2000

*Primary Examiner*—Jayprakash N Gandhi
*Assistant Examiner*—Bradley H Thomas
(74) *Attorney, Agent, or Firm*—Katten Muchin Rosenman LLP

(57) ABSTRACT

An information processing device includes: an object to be cooled (51, 52) as a heat-generating body; a cooling unit (32) that is provided on a first side of the object (51) to be in contact therewith; and a plate spring (36) disposed on a second side of the object (51) opposite to first side and attached to the cooling unit (32), the plate spring biasing the cooling unit (32) in a direction for the cooling unit (32) to be pressed to the object (51). Since the object (51) and the cooling unit (32) can be brought in closer contact with each other, the heat on the object (51) can be efficiently transferred to the cooling unit, thereby radiating the heat. Accordingly, the heat generated on the object (51) can be efficiently cooled. The object (51) is sandwiched by the plate spring (36) and the cooling unit (32), unidirectional load is not applied on the object (51), so that deformation of the object (51) can be restrained.

7 Claims, 28 Drawing Sheets

U.S. PATENT DOCUMENTS

| | | | |
|---|---|---|---|
| 6,337,228 B1 * | 1/2002 | Juskey et al. | 438/122 |
| 6,356,446 B1 * | 3/2002 | Guerrero | 361/704 |
| 6,392,891 B1 * | 5/2002 | Tzlil et al. | 361/719 |
| 6,411,522 B1 * | 6/2002 | Frank et al. | 361/800 |
| 6,449,157 B1 * | 9/2002 | Chu | 361/704 |
| 6,473,306 B2 * | 10/2002 | Koseki et al. | 361/704 |
| 6,477,058 B1 * | 11/2002 | Luebs et al. | 361/784 |
| 6,504,712 B2 * | 1/2003 | Hashimoto et al. | 361/679.54 |
| 6,534,860 B2 * | 3/2003 | Turner | 257/718 |
| 6,545,879 B1 * | 4/2003 | Goodwin | 361/807 |
| 6,565,444 B2 * | 5/2003 | Nagata et al. | 463/46 |
| 6,574,101 B2 * | 6/2003 | Tanaka et al. | 361/679.5 |
| 6,593,673 B1 * | 7/2003 | Sugai et al. | 307/116 |
| 6,603,665 B1 * | 8/2003 | Truong et al. | 361/752 |
| 6,714,414 B1 * | 3/2004 | Dubovsky et al. | 361/704 |
| 6,742,573 B2 * | 6/2004 | Sasaki et al. | 165/80.3 |
| 6,791,838 B1 * | 9/2004 | Hung et al. | 361/704 |
| 6,850,411 B1 * | 2/2005 | Patel | 361/704 |
| 6,862,181 B1 * | 3/2005 | Smith et al. | 361/690 |
| 6,865,082 B2 * | 3/2005 | Huang et al. | 361/700 |
| 7,095,614 B2 * | 8/2006 | Goldmann | 361/704 |
| 7,111,674 B2 * | 9/2006 | Pedoeem et al. | 165/185 |
| 7,254,035 B2 * | 8/2007 | Sasaki et al. | 361/721 |
| 7,277,293 B2 * | 10/2007 | Yang et al. | 361/719 |
| 7,344,384 B2 * | 3/2008 | Rubenstein et al. | 439/73 |
| 7,382,621 B2 * | 6/2008 | Peng et al. | 361/719 |
| 7,436,664 B2 * | 10/2008 | Hori et al. | 361/695 |
| 7,447,023 B2 * | 11/2008 | Chen et al. | 361/695 |
| 7,536,781 B2 * | 5/2009 | Cromwell | 29/832 |
| 7,595,992 B2 * | 9/2009 | Koga | 361/719 |
| 7,652,878 B2 * | 1/2010 | Tsai | 361/679.33 |
| 2003/0079861 A1 * | 5/2003 | Lee | 165/80.3 |
| 2005/0068740 A1 * | 3/2005 | Ulen et al. | 361/719 |
| 2005/0068741 A1 * | 3/2005 | Bailey et al. | 361/719 |
| 2005/0117296 A1 * | 6/2005 | Wu et al. | 361/697 |
| 2007/0047211 A1 * | 3/2007 | Refai-Ahmed et al. | 361/720 |
| 2008/0055861 A1 * | 3/2008 | Nagareda et al. | 361/707 |
| 2008/0106866 A1 * | 5/2008 | Hori et al. | 361/695 |

* cited by examiner

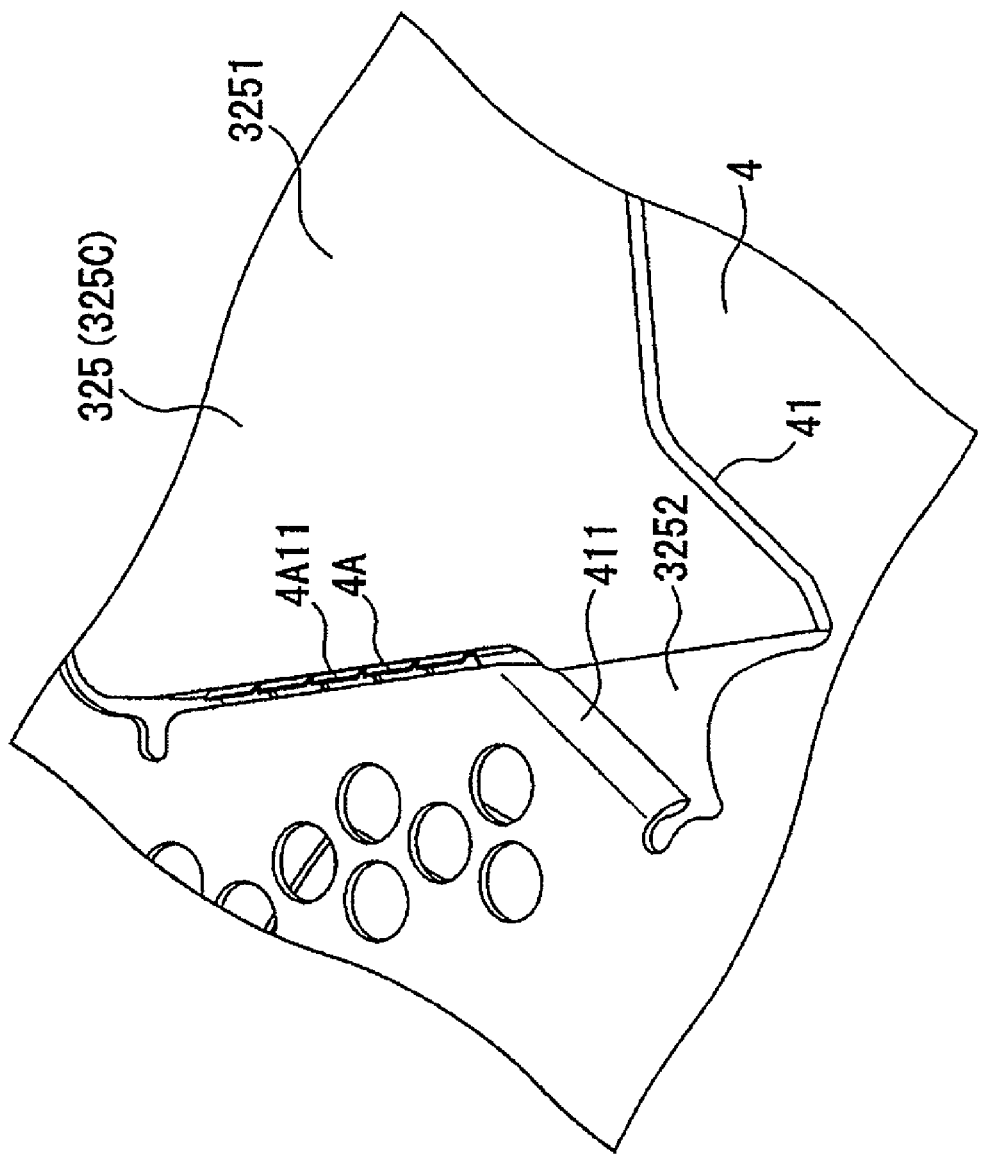

INFORMATION PROCESSING DEVICE

BACKGROUND OF THE INVENTION

1. Field of the Invention

The present invention relates to an information processing device having an object to be cooled, which is a heat-generating body, and a cooling unit for radiating the heat transferred from the object.

2. Description of Related Art

Information processing devices provided with a integrated circuit such as a CPU (Central Processing Unit) are conventionally known. Such information processing device includes a personal computer (PC) and a disc reproducing device that reproduces image and sound information recorded in a recording medium such as an optical disc including CD (Compact Disc), DVD (Digital Versatile Disc), BD (Blu-ray Disc: registered trade name) and the like or stored in a memory medium such as a semiconductor memory card and an HDD (Hard Disk Drive).

Since the integrated circuits used in the information processing device (especially, a CPU) generate large amount of heat and are weak against heat, the integrated circuits have to be efficiently cooled in order to ensure stable operation of the information processing device. Recent size-reduction of electronics contributes accumulation of heat generated by a heat-generating body such as the integrated circuits within the electronics. Also, the amount of the heat generated increases in accordance with improvement in processing speed of the integrated circuits. Therefore, there is growing necessity for efficient cooling of the integrated circuits.

In order to cool the integrated circuits, a structure has been developed, where a heat sink is provided to cover a CPU and a chipset that are juxtaposed on a circuit board. The heat of the CPU and the chipset transferred to the heat sink is cooled by a fan (see, for instance, Document 1: JP2000-20172A).

In the cooling mechanism shown in the Document 1, the chipset that generates relatively small heat is cooled by internal air inside the information processing device (PC). The CPU that generates relatively large amount of heat is cooled by external air introduced from the outside of the information processing device. The above arrangement allows cooling of the CPU with the use of external air that is cooler than the internal air.

The heat sink and the fan of the cooling mechanism shown in the Document 1 are fixed by a screw and the like on a side of the circuit board on which the integrated circuits such as the CPU and the chipset are mounted. In the above mechanism, however, the tightening force of the screw screwed into the board to secure the heat sink and the fan may deform the circuit board. The disadvantage is prominently recognized in securing a large-size heat sink and fan on the circuit board, where greater tightening force has to be applied.

Further, since the heat sink is not in contact with the CPU (object to be cooled) in the cooling mechanism shown in the Document 1, the heat is not directly transferred from the CPU to the heat sink. Thus, since the heat generated by the CPU is dissipated only via a casing of the CPU, only a small heat-radiation area can be obtained, which results in poor cooling efficiency even when the cooling air is sent from the fan.

SUMMARY OF THE INVENTION

An object of the present invention is to provide an information processing device that can restrain deformation of an object to be cooled and can efficiently cool the object.

An information processing device according to an aspect of the invention includes: an object to be cooled, the object being a heat generating body; a cooling unit that is in contact with a first side of the object for radiating the heat transferred from the object; a biasing plate provided on a second side of the object opposite to the first side, the biasing plate being attached to the cooling unit, the biasing plate biasing the cooling unit in a direction for the cooling unit to be pressed onto the object.

BRIEF DESCRIPTION OF THE DRAWINGS

FIG. 28 is a perspective view showing the holder piece and a heat-receiving block of the embodiment.

DETAILED DESCRIPTION OF PREFERRED EMBODIMENT(S)

An embodiment of the present invention will be described below with reference to attached drawings.

(1) Arrangement of Information Processing Device 1

Figure 1:
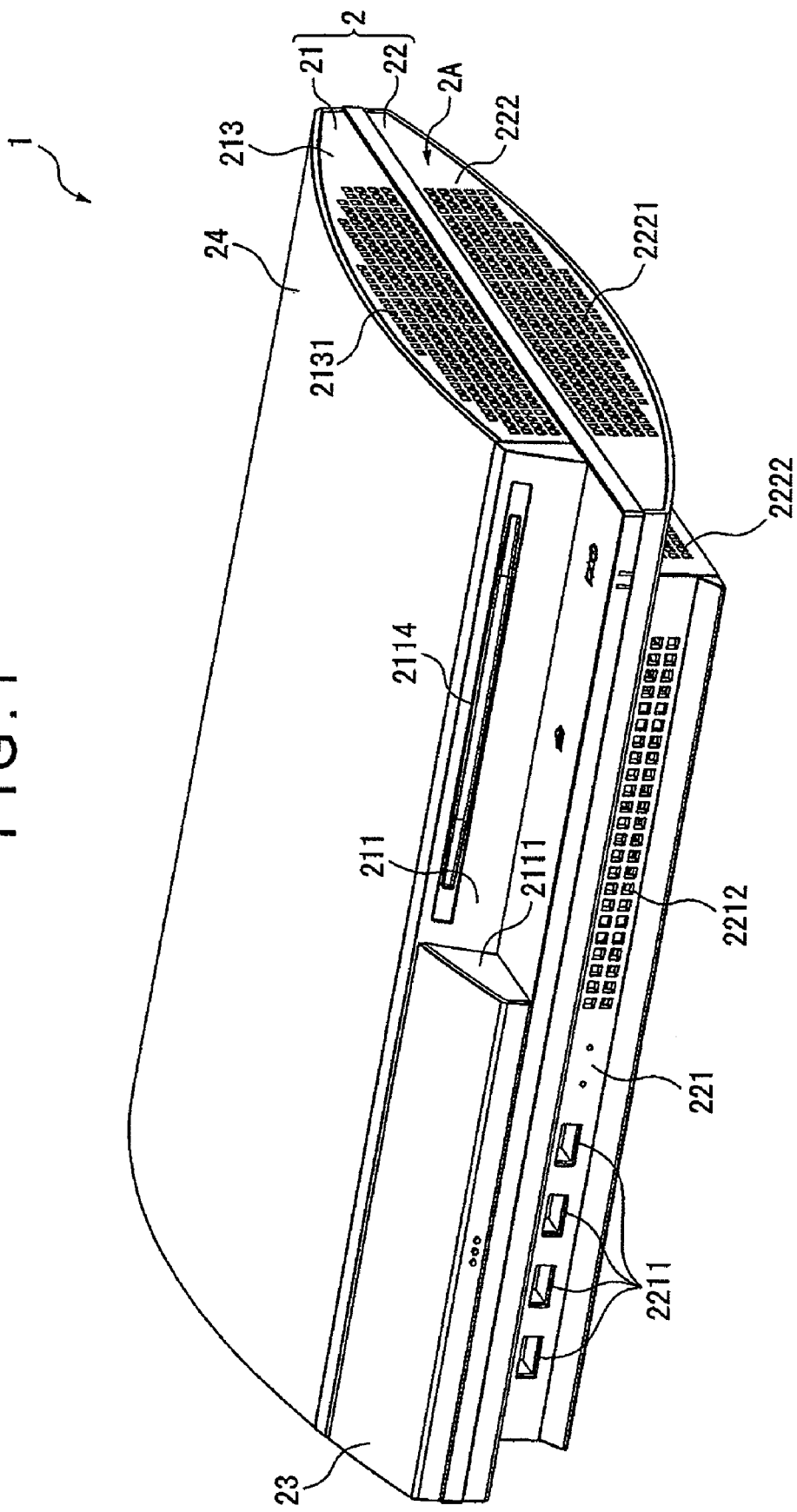
FIG. 1 is a perspective view showing a front side of an information processing device according to an embodiment of the present invention.
Figure 2:
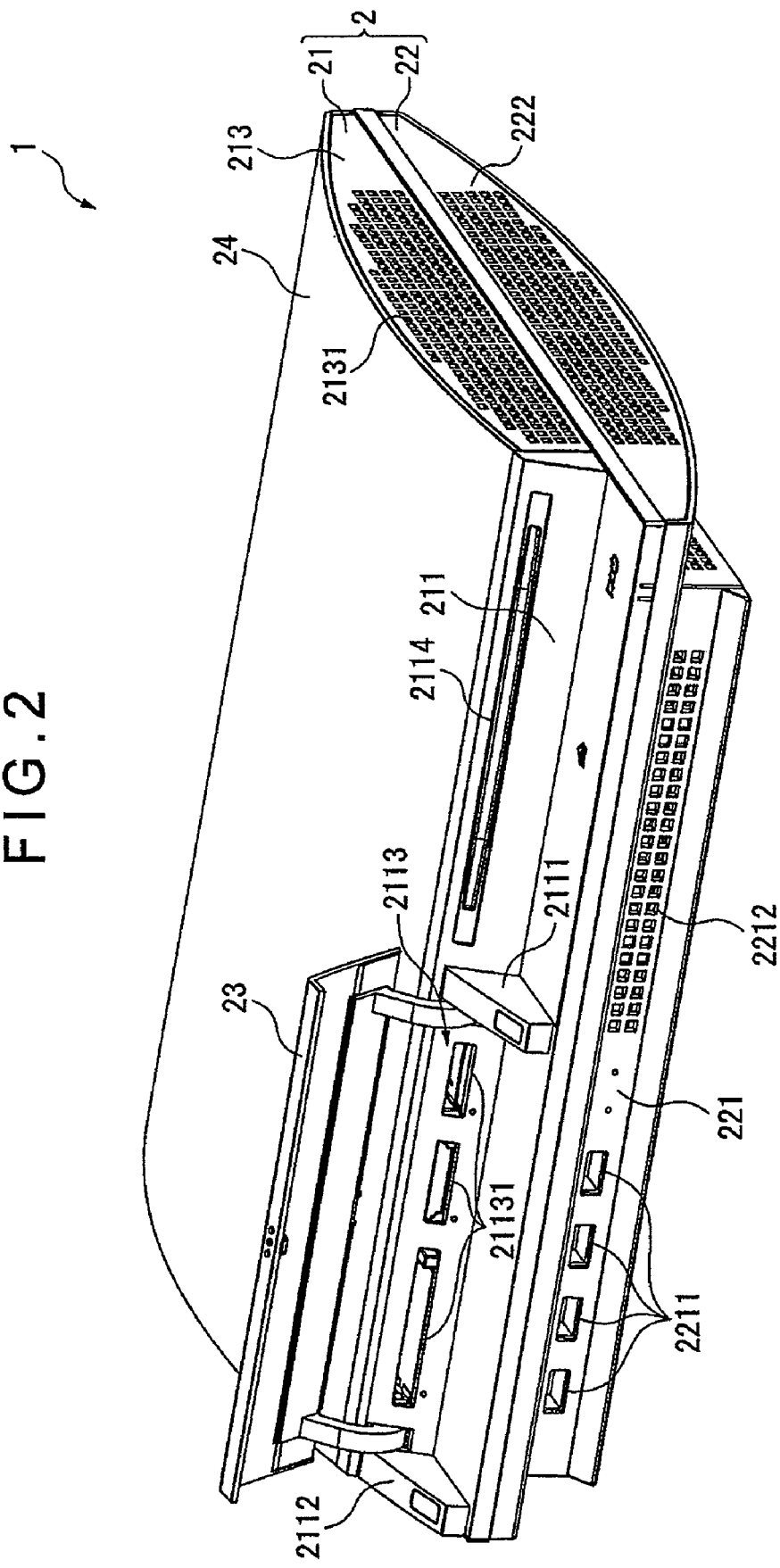
FIG. 2 is a perspective view showing the front side of the information processing device of which cover is opened.

FIG. 1 is a perspective view showing a front side of an information processing device 1 according to the present embodiment. FIG. 2 is a perspective view showing a front side of the information processing device 1 of which cover 23 is opened.

The information processing device 1 of the embodiment is an electronic device that, in response to a command from a controller (not shown) operated by a user, or automatically, acquires information recorded or stored in a recording medium such as an optical disk including CD, DVD and BD and the like or in a recording medium such as various semiconductor memory cards and HDD (Hard Disk Drive), or acquires information through a network. The information processing device 1 reproduces image information and sound information contained in the acquired information. The information processing device 1 also runs a program contained in the acquired information. The information processing device 1 is also adapted to record information on an optical disk (in accordance with the type of the optical disk employed) and on a mounted recording medium such as semiconductor memory card, HDD and the like. Though not illustrated, such information processing device 1 is electrically connected with an image display such as TV set. When a user operates the controller, the information processing device 1 performs a predetermined processing in accordance with the operation by the user to output an image signal and sound signal onto the image display in accordance with the processing results.

The information processing device 1 includes an exterior casing 2 (FIGS. 1 to 6) and a device body 3 (FIGS. 7 to 9) housed within the exterior casing 2.

(2) Arrangement of Exterior Casing 2

As illustrated in FIGS. 1 and 2, the exterior casing 2 is configured substantially in an elliptic cylinder. The exterior casing 2 includes an upper casing 21 to which a decorative plate 24 is attached, and a lower casing 22.

(2-1) Arrangement of Upper Casing 21

Figure 3:
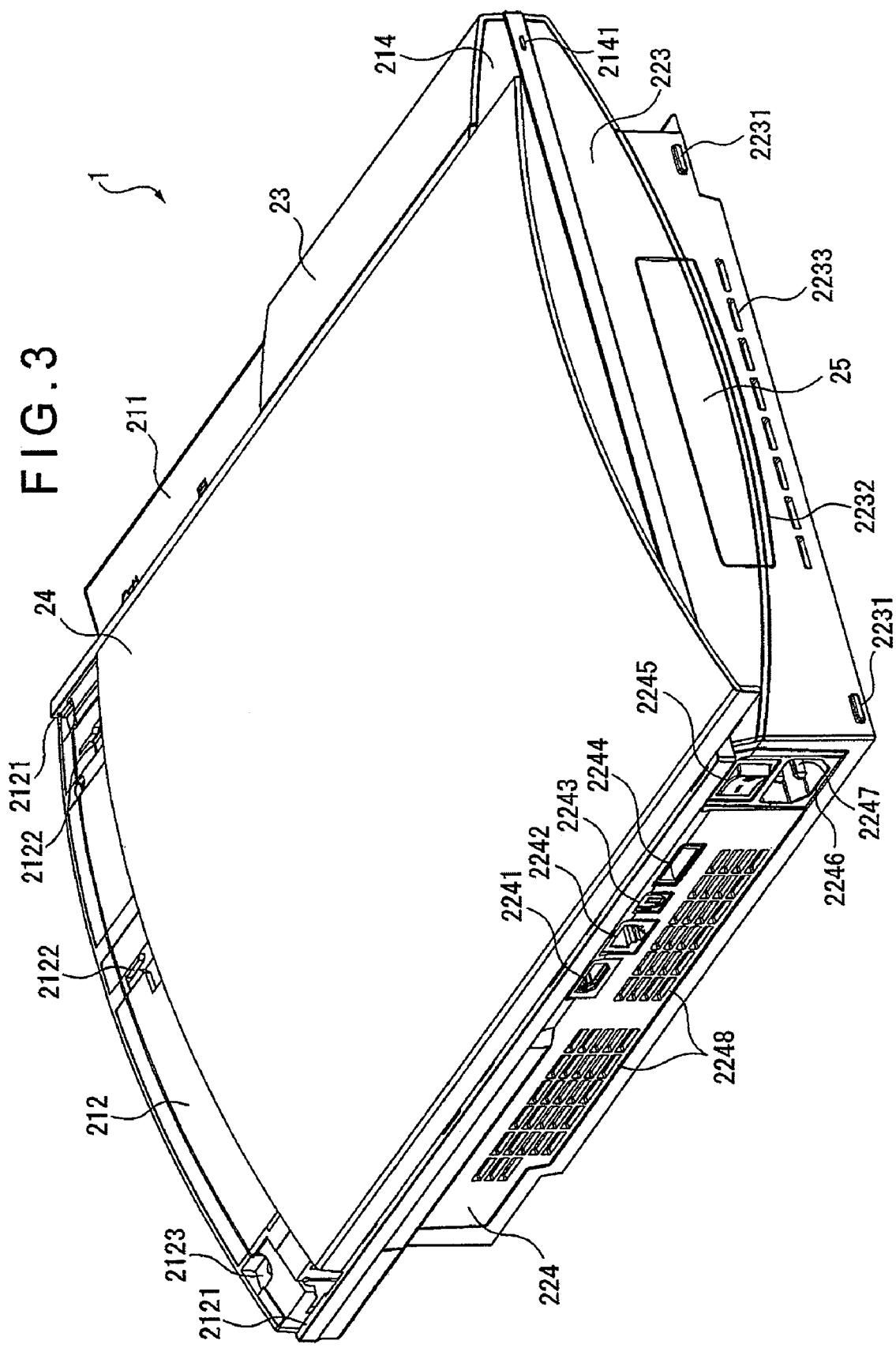
FIG. 3 is a perspective view showing a rear side of the information processing device of the embodiment in which decorative plate is displaced.

The upper casing 21 is a box-shaped component having a circular curved section, which is assembled and screwed with the lower casing 22. The upper casing 21 has a front side 211 (FIGS. 1, 2 and 4), an upper side 212 (FIGS. 3 and 4) and lateral sides 213 (FIGS. 1, 2 and 4), 214 (FIG. 3).

The front side 211 is a near side shown in FIGS. 1 and 2. The front side 211 is provided with projections 2111, 2112 that project in an out-plane direction approximately at the center and on the left end thereof. A card slot 2113 is provided on an area sandwiched by the projections 2111, 2112. The card slot 2113 is provided with three openings 21131 to allow insertion and removal of various semiconductor memory cards (referred to as "memory card" hereinafter) as shown in FIG. 2. Inserting sections of below-described reader/writer corresponding to various types of memory cards provided in the exterior casing 2 are exposed through the openings 2113.

On the area in which the projections 2111 and 2112 and the card slot 2113 are provided, a cover 23 that covers the projections 2111, 2112 and the card slot 2113 is provided in a rotatable manner. The cover 23 has a rotary axis extending along the longitudinal direction of the front side 211, which rotates upward around the rotary axis to uncover the card slot 2113 and rotates downward to cover the card slot 2113.

A disk insertion slot 2114 compatible with 12 cm-diameter optical disk is provided along the longitudinal direction of the front side 211. After the optical disk inserted into the disk insertion slot 2114, the optical disk is inserted into a disk unit 33 constituting the below-described device body 3.

A plurality of air inlets 2131 that intake cooling air for cooling the device body 3 accommodated within the exterior casing 2 from an outside of the exterior casing 2 are formed on the right (in FIGS. 1 and 2) lateral side 213.

Figure 4:
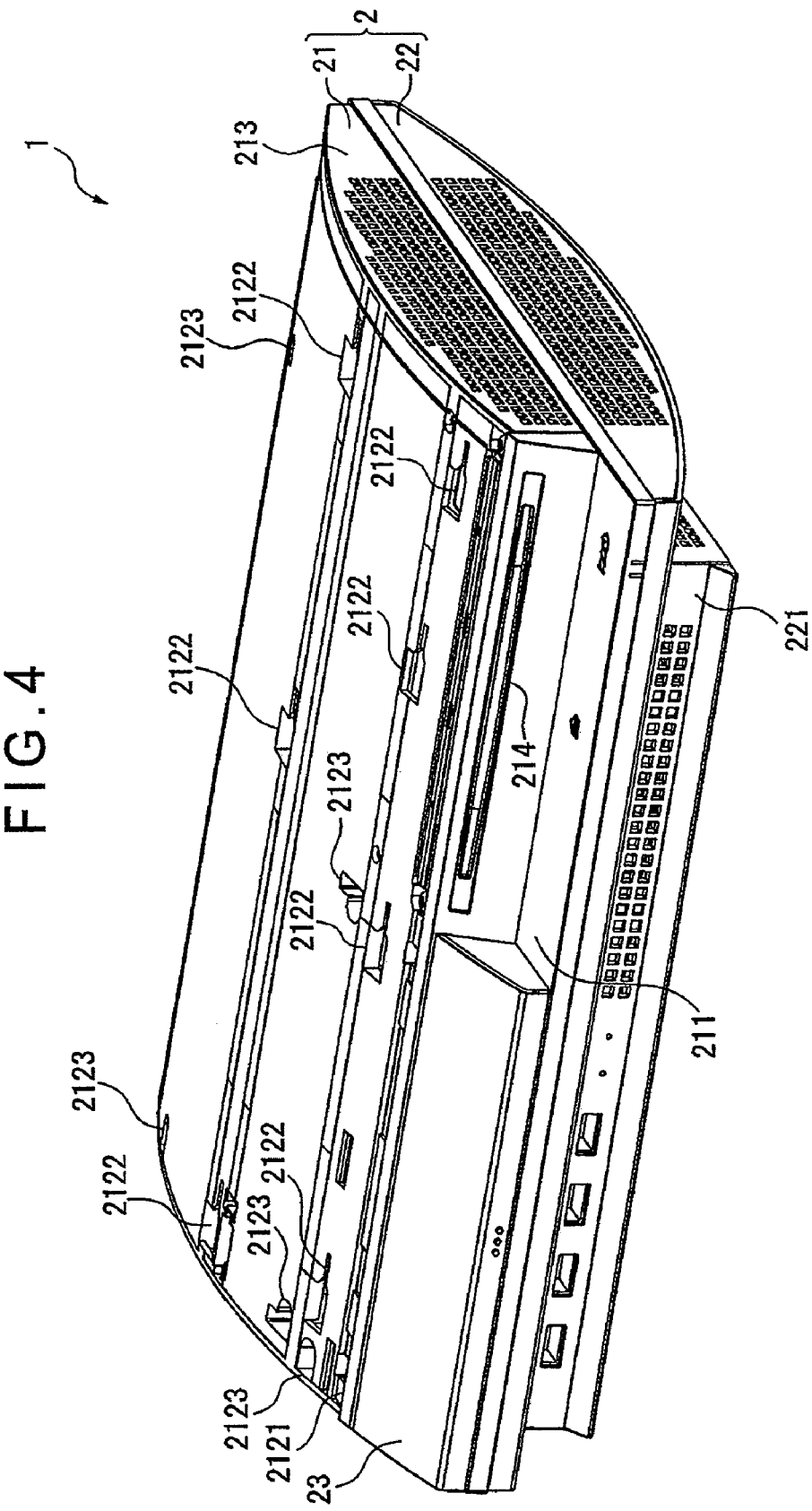
FIG. 4 is a perspective view showing a front side of the information processing device of the embodiment in which decorative plate is removed.

FIG. 3 is a perspective view showing a rear side of the information processing device 1 with the decorative plate 24 being displaced. FIG. 4 is a perspective view showing a front side of the information processing device 1 with the decorative plate 24 being removed.

As shown in FIG. 3, the decorative plate 24 that covers the upper side 212 of the upper casing 21 is slidably attached on the upper side 212. The decorative plate 24 is aligned with the curved configuration of the upper side 212, which is attached to the upper side 212 by a slide movement along the longitudinal direction of the upper side 212.

When the decorative plate 24 is removed, a pair of grooves 2121, a plurality of engaging portions 2122 and screw insertion holes 2123 provided on the upper side 212 are exposed as shown in FIG. 4.

The grooves 2121 are provided on both ends (in widthwise direction, i.e. a direction orthogonal to the longitudinal direction) of the upper side 212 along the longitudinal direction of the upper side 212 to guide the slide movement of the decorative plate 24 along the upper side 212. The engaging portions 2122 are provided on a backside (a side facing the upper side 212) of the decorative plate 24, which are engaged with hook-shaped stoppers (not shown) to prevent removal of the decorative plate 24 from the upper side 212. A screw that fixes the upper casing 21 and the device body 3 is inserted into the screw insertion hole 2123.

As shown in FIG. 3, legs 2141 made of rubber and the like are provided on both ends in longitudinal direction of the lateral side 214.

(2-2) Arrangement of Lower Casing 22

As shown in FIGS. 1 and 2, the lower casing 22 is configured by a combination of a rectangular parallelepiped and a half-cylinder, which is assembled with the upper casing 21 so that the half-cylindrical sections are opposed.

The lower casing 22 has an opening 22A (FIG. 6) for housing the device body 3 on the lower casing 22 on a side facing the upper casing 21. The lower casing 22 includes a front side 221 (FIGS. 1 and 2), lateral sides 222 (FIGS. 1 and 2)/223 (FIG. 3), a rear side 224 (FIG. 3), a bottom side 225 (FIG. 5) and an interior section 226 (FIG. 6).

Four substantially rectangular openings 2211 are provided on left side (near side in FIGS. 1 and 2) of the front side 221. Terminals that are adapted to receive A-terminals compatible with USB (Universal Serial Bus) standard provided on a control board 5 (FIGS. 18 and 19) are respectively exposed through the openings 2211. A plurality of substantially rectangular air intakes 2212 are provided on the right side of the opening 2211 of the front side 221. The air outside the exterior casing 2 is introduced into the exterior casing 2 through the air intake 2212.

Further, air intakes 2213 (FIG. 5) for introducing the air outside the exterior casing 2 are provided on a bottom side of an extension of the front side 221.

Figure 5:
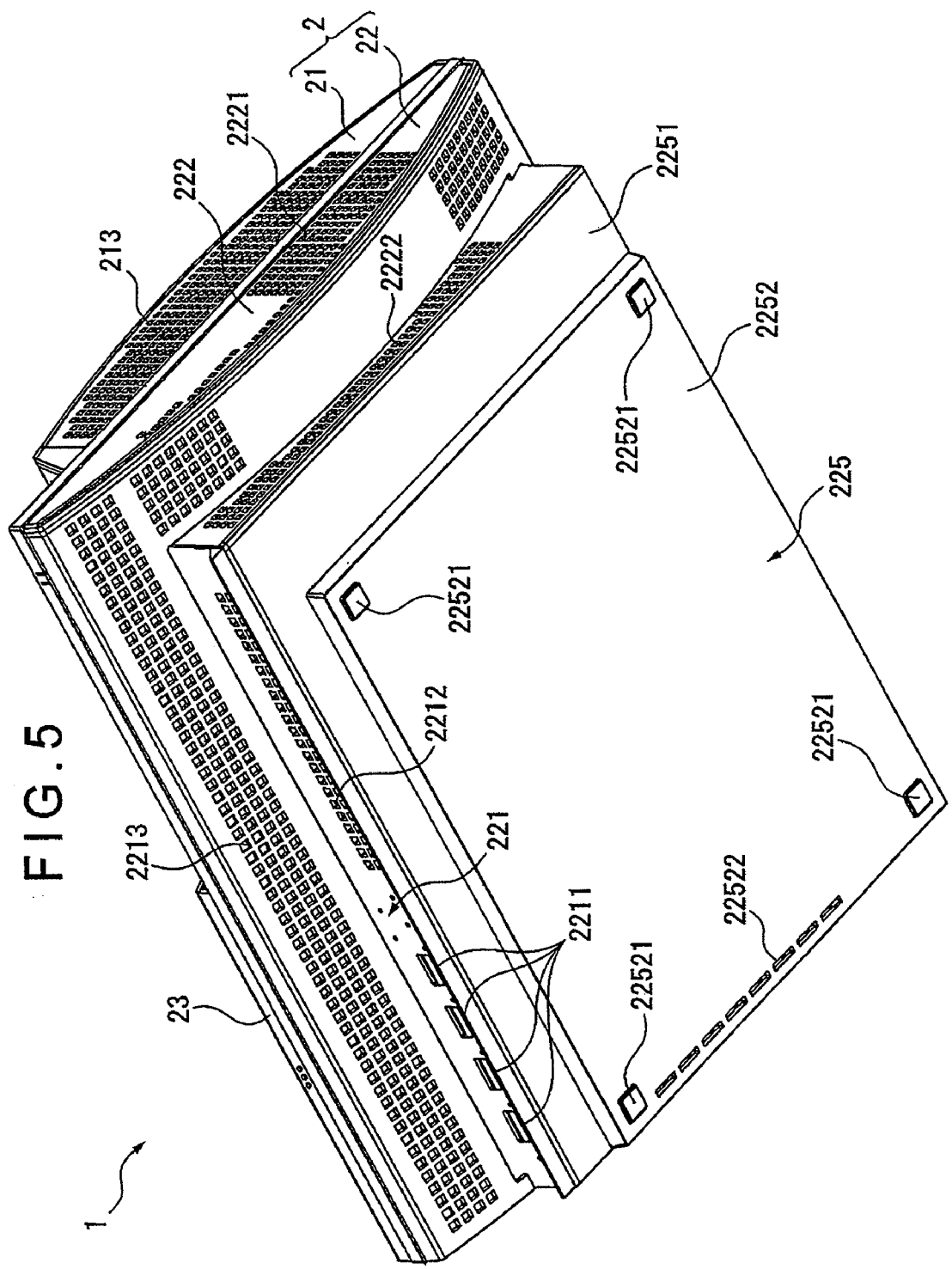
FIG. 5 is a perspective view showing a lower side of the information processing device of the embodiment.
Figure 6:
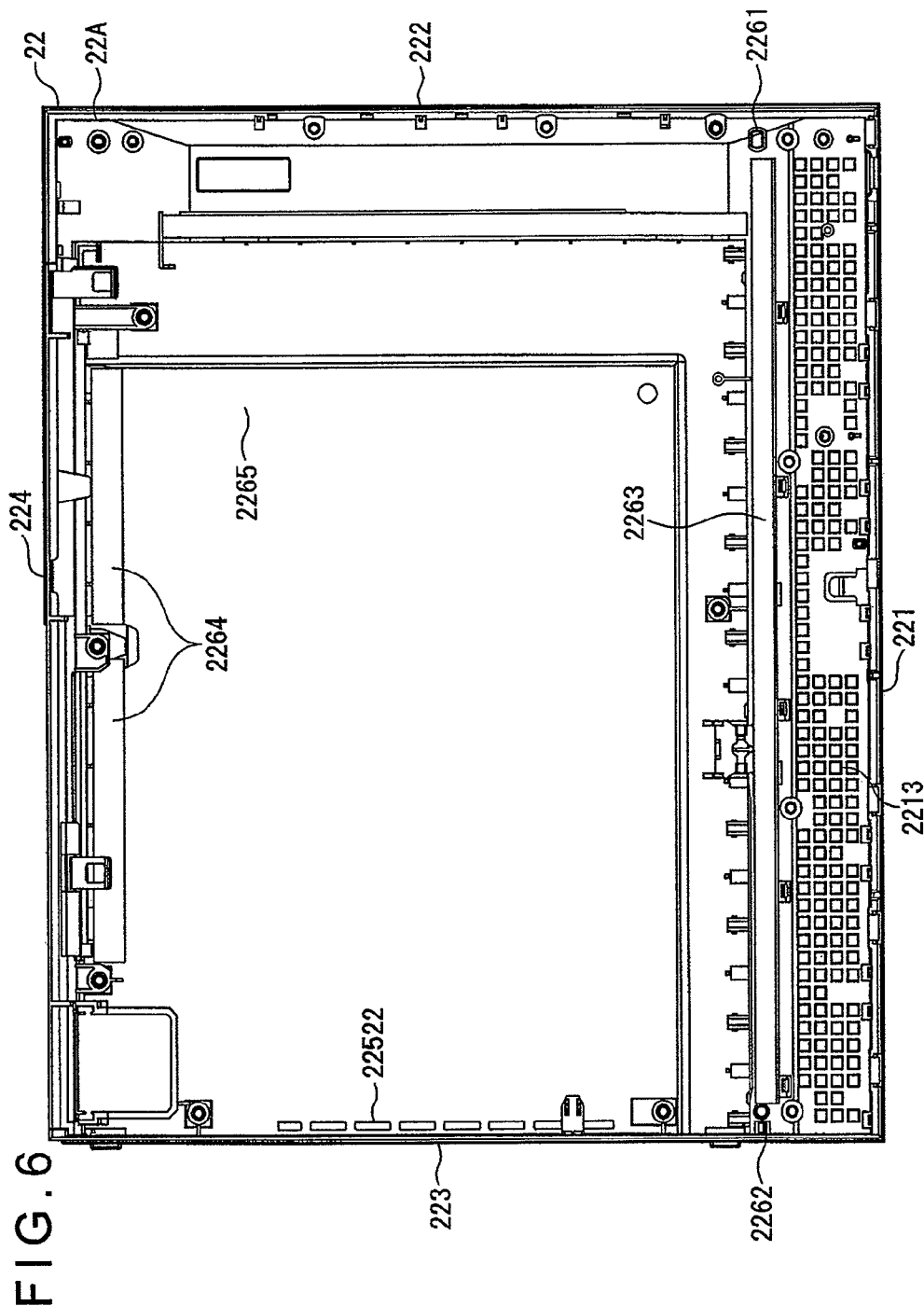
FIG. 6 is a plan view showing an interior of a lower casing of the embodiment.

A step is provided on the right (in FIGS. 1 and 2) lateral side 222, i.e. a lateral side corresponding to the lateral side 213 of the upper casing 21, where upper portion protrudes and lower portion recesses by the presence of below-described first step portion 2251 (FIG. 5). On a surface of the step along extending direction of the lateral side 213, air outlets 2221, 2222 through which the cooling air after cooling the device body 3 is discharged are provided. Specifically, the air outlets 2221 are provided on lateral side of the upper projecting portion and the air outlets 2222 are provided on lateral side of the lower recessed portion.

Accordingly, the air intakes 2131 and the air outlets 2221 are provided on the same surface 2A of the exterior casing 2 defined by the lateral sides 213, 222 of the exterior casing 2.

As shown in FIG. 3, on both ends of the lateral side 223, legs 2231 made of rubber and the like are provided. The information processing device 1 can be vertically placed by bringing the legs 2231 provided on the lateral side 223 and the legs 2141 provided on the lateral side 214 of the upper casing 21 into contact with a mount surface.

A substantially rectangular opening 2232 is provided approximately at the center of the lateral side 223. A HDD (Hard Disk Drive) unit (not shown) is attached through the opening 2232. The opening 2232 is closed by a cover 25 having a configuration corresponding to the opening 2232.

On the lower side of the opening 2232, a plurality of air intakes 2233 are provided along the longitudinal direction of the lateral side 223.

As shown in FIG. 3, openings 2241 to 2244 for exposing various terminals 59 (FIG. 19) provided on the control board 5 housed within the exterior casing 2 are arranged on the rear side 224 along the longitudinal direction.

Specifically, respectively exposed through the openings 2241 to 2244 are: a terminal adapted to receive a HDMI (High-Definition Multimedia Interface}; a terminal compatible with IEEE802.3i to which LAN (Local Area Network) cable such as 10Base-T and 100Base-TX can be connected; a terminal adapted to receive B-terminal compatible with USB standard; and a terminal adapted to receive coaxial cable having one terminal for image and two terminals for sound on one end.

Further, a power switch 2245 for turning on/off main power is provided on the right end of the rear side 224. An opening 2246 for exposing an inlet connector 2247 to which a power cable (not shown) is connected is provided below the power switch 2245.

Additionally, air outlets 2248 for discharging the cooling air after cooling the device body 3 within the exterior casing 2 is provided on an area of the rear side 224 other than the area at which the openings 2241 to 2244 and 2246 are provided and the area provided with the power switch 2245.

Incidentally, though not shown in detail, a sponge is provided on the interior surface of the rear side 224, which interconnects a discharge port 328 (FIGS. 22 and 23) to the air outlet 2248 to prevent the air discharged through the discharge port 328 from being sucked by the cooling unit 32.

FIG. 5 is a perspective view showing a lower side of the information processing device 1.

The bottom side 225 of the lower casing 22 is a portion corresponding to a bottom side of rectangular parallelepiped section of the lower casing 22 remote from the upper casing 21. As shown in FIG. 5, the bottom portion 225 is provided with a double-decked first step portion 2251 and a second step portion 2252 projecting downward.

Specifically, the first step portion 2251 is recessed inward relative to the front side 221 and is flush with the lateral side 223 and the rear side 224 (FIG. 3). The second step portion 2252 is disposed inside the first step portion 2251, where the second step portion 2252 is recessed inward relative to the front side 221 and the lateral side 222 and is flush with the lateral side 223 and the rear side 224. The openings 2211 and the air intakes 2212 are provided on the front side of the first step portion 2251. The air outlets 2222 are provided on the lateral side of the first step portion 2251.

The second step portion 2252 has a plurality of rubber legs 22521 on four corners of the bottom side thereof. The information processing device 1 can be horizontally placed when the information processing device 1 is laid so that the legs 22521 touch a mount surface.

Further, the second step portion 2252 is provided with air intakes 22522 similar to the air intake 2233 (FIG. 3) on a side near the lateral side 223 along widthwise direction (i.e. a direction along the lateral side 223).

FIG. 6 is a plan view showing an interior section 226 of a lower casing 22.

As described above, the interior section 226 of the lower casing 22 is provided with an opening 22A for housing the device body 3. Though not specifically illustrated, a plurality of threaded holes are provided along the outer circumference of the lower casing 22. Screws for rigidly securing the device body 3 and the upper casing 21 to the lower casing 22 are screwed into the threaded holes.

Figure 14:
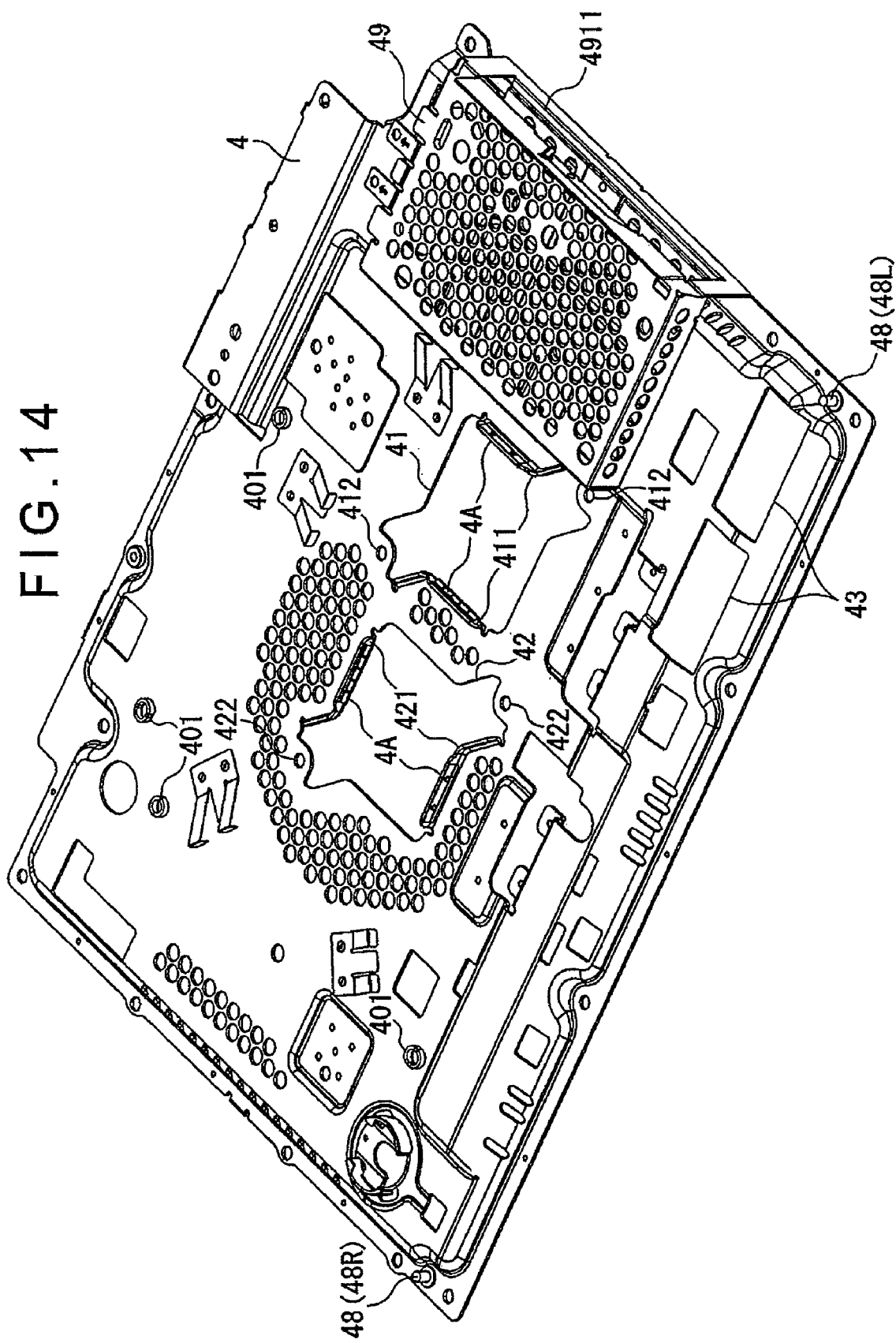
FIG. 14 is a perspective view showing a lower side of the main-frame of the embodiment.

The lower casing 22 has fitting holes 2261, 2262 on both ends of the front side 221 thereof. Pins 48 (48R, 48L: FIG. 14) provided on a below-described main-frame 4 constituting a control unit 31 of the device body 3 are fitted into the fitting holes 2261, 2262, thereby positioning the control unit 31 on the lower casing 22. Incidentally, the fitting hole 2261 provided on a side near the lateral side 222 shows substantially oblong shape in plan view and the fitting hole 2262 provided near the lateral side 223 shows substantially circular shape. Accordingly, even when the position of the pins 48R, 48L is slightly deviated relative to the fitting holes 2261, 2262 on account of manufacturing errors and the like, the pins 48R, 48L can be fitted into the fitting holes 2261, 2262. The pin 48R is fitted into the fitting hole 2261 and the pin 48L is fitted into the fitting hole 2262.

On the interior section 226 near the front side 221, a sponge 2263 is provided along the extending direction (longitudinal direction) of the front side 221. Specifically, the sponge 2263 is disposed on a base end of the extension of the front side 221 on which the air inlet 2213 is provided. The sponge 2263 is in contact with the lower side of the main-frame 4 of the control unit 31 when the below-described control unit 31 is housed within the lower casing 22. The sponge 2263 prevents the cooling air introduced from the outside of the exterior casing 2 through the air intake 2213 from directly flowing into the cooling unit 32 disposed on the lower side of the control unit 31.

The interior section 226 has a sponge 2264 at a position corresponding to the air outlet 2248 provided on the rear side 224 along the extending direction (longitudinal direction) of the rear side 224. The sponge 2264 abuts to the periphery of the discharge port 328 (FIG. 22) of the below-described cooling unit 32 to enhance sealability between the discharge port 328 and the air outlet 2248. Accordingly, the cooling air that flows out from the discharge port 328 is discharged to the outside of the exterior casing 2 from the air outlet 2248 without leakage.

The interior section 226 has a contact portion 2265 to be in contact with a sponge 3271 (FIG. 22) provided around a below-described discharge port 327 of the cooling unit 32 near the lateral side 222 at an area corresponding to the second step portion 2252 (FIG. 5) provided on the bottom side 225. When the sponge 3271 contacts the contact portion 2265, the cooling air flowed out from the discharge port 327 of the cooling unit 32 is discharged from the air outlet 2222 (FIG. 1) provided on the lateral side 222 without leakage.

(3) Arrangement of Device Body 3

Figure 7:
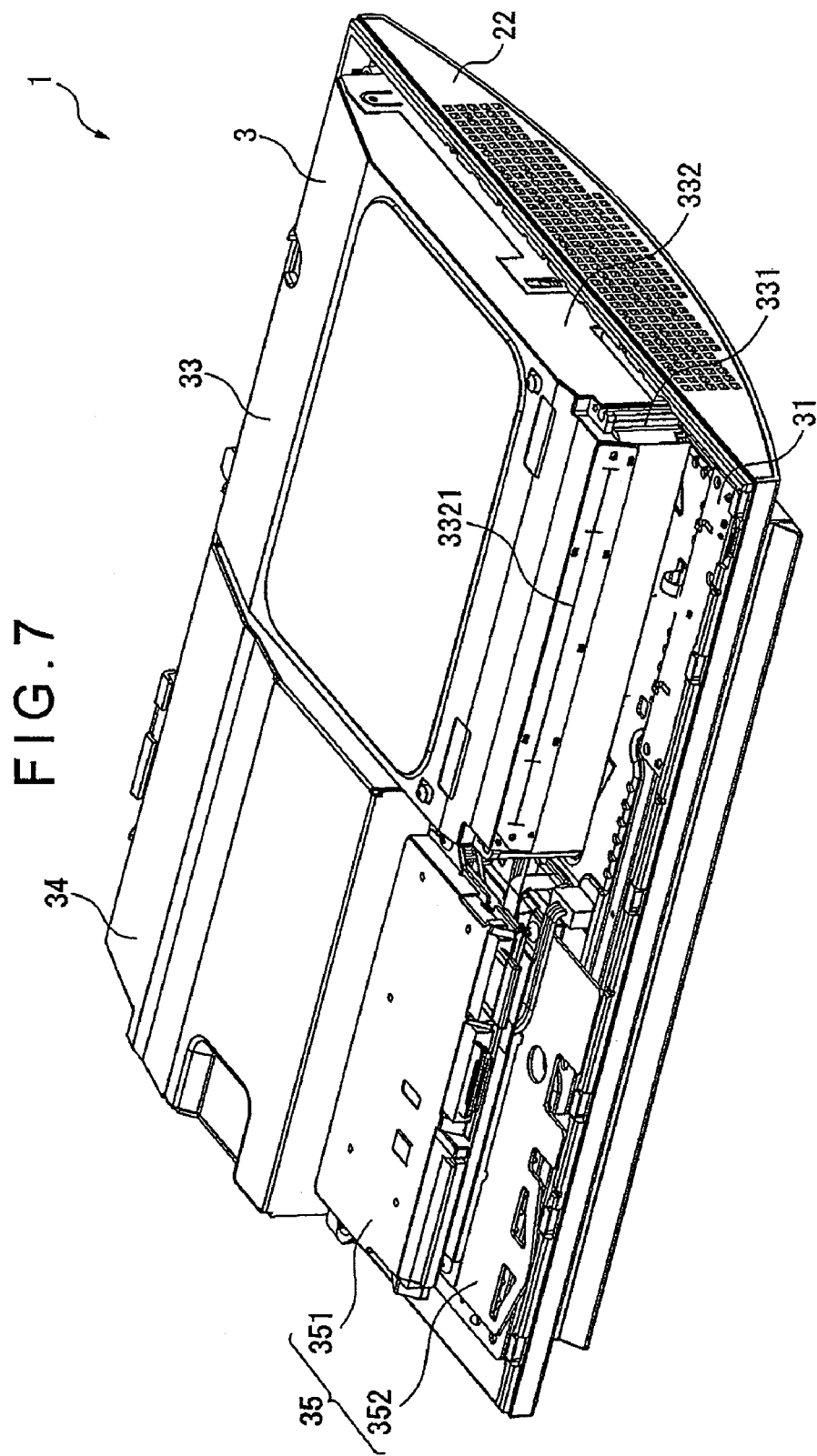
FIG. 7 is a perspective view showing a front side of the information processing device of the embodiment in which upper casing is removed.
Figure 8:
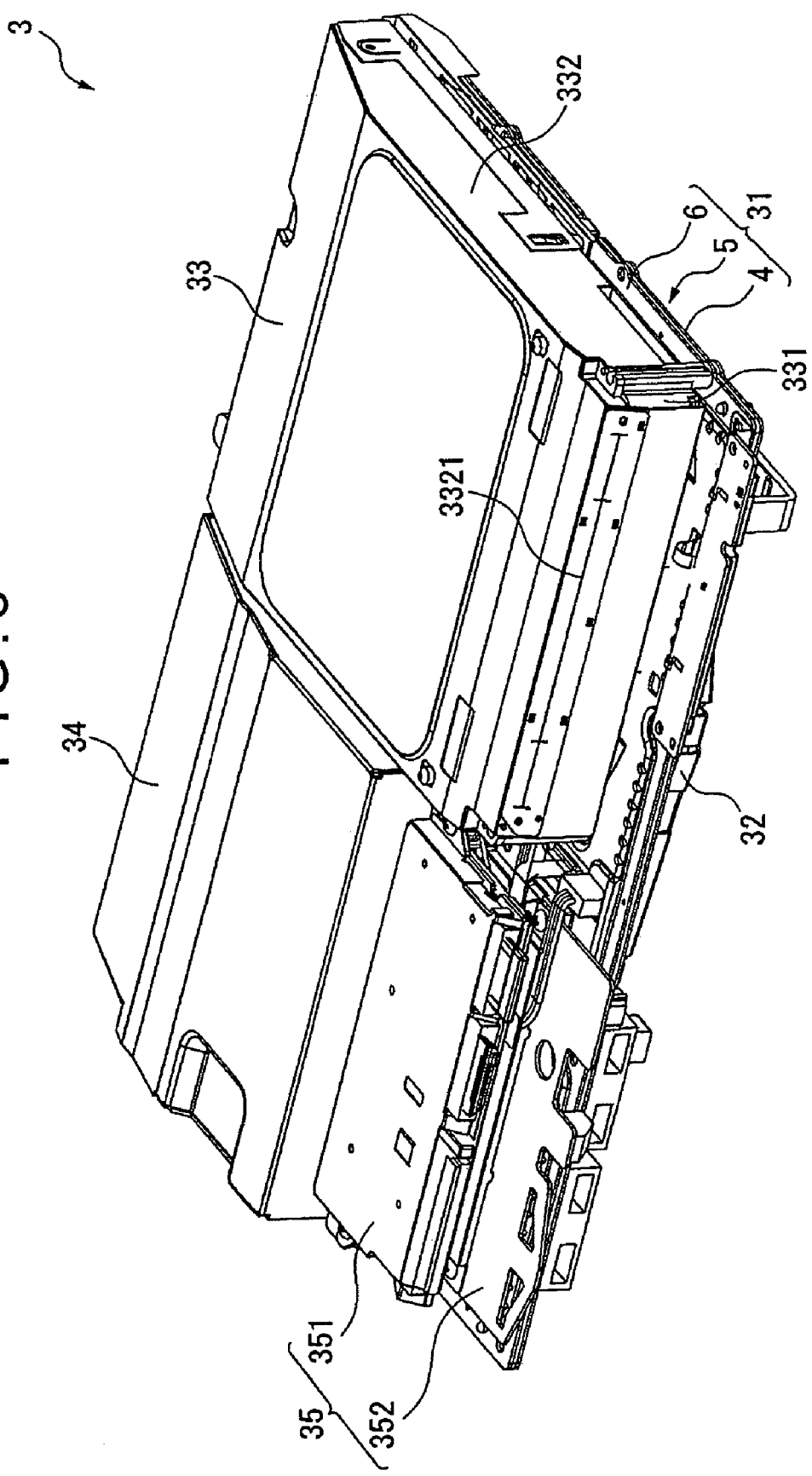
FIG. 8 is a perspective view showing a front side of a device body of the embodiment.
Figure 9:
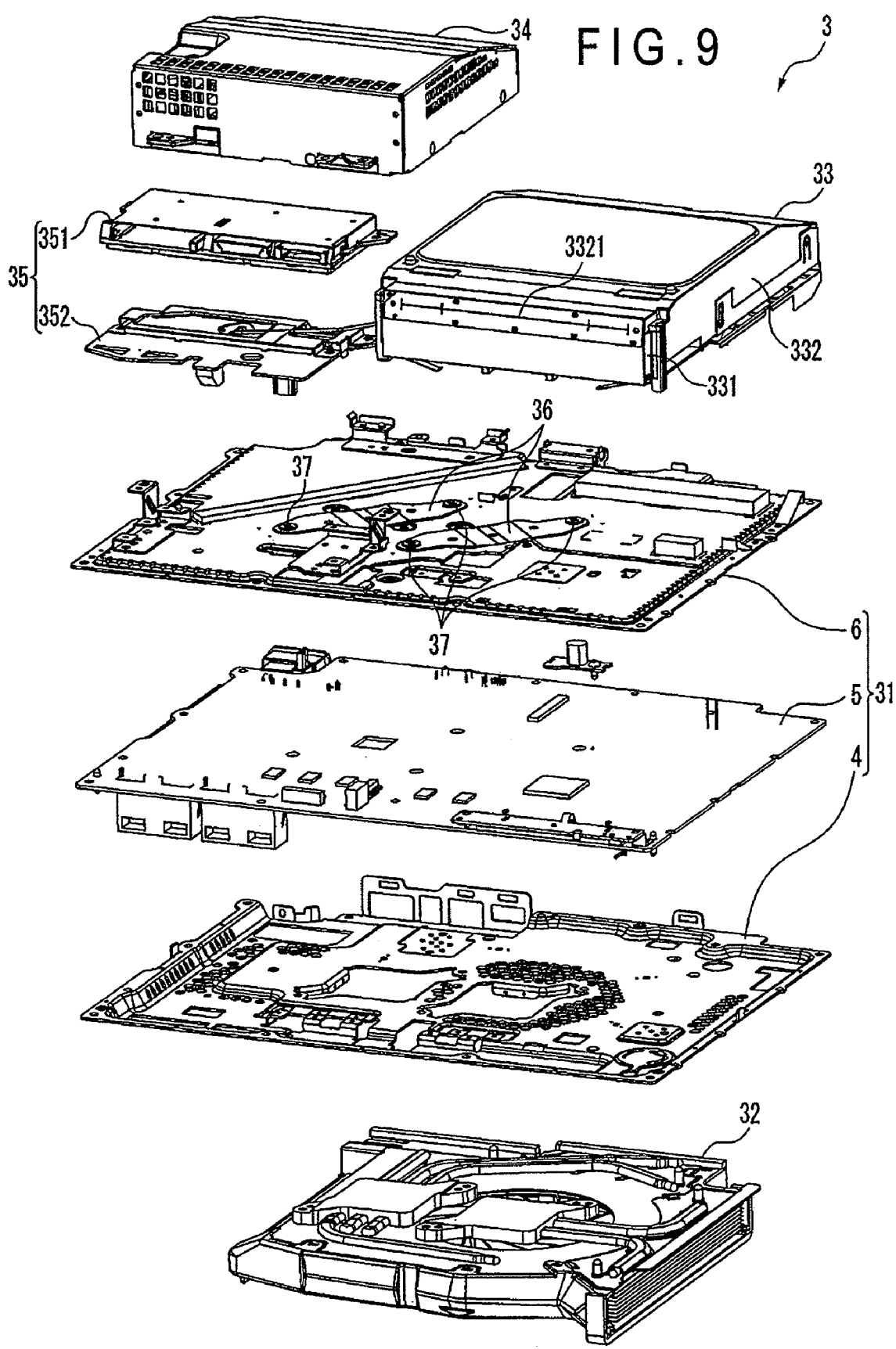
FIG. 9 is an exploded perspective view showing the device body of the embodiment.

FIG. 7 is a perspective view showing a front side of the information processing device 1 in which upper casing 21 is removed. FIG. 8 is a perspective view of the front side of the device body 3. FIG. 9 is an exploded perspective view showing the device body 3.

As shown in FIG. 7, the device body 3 is housed within the external casing 2. As shown in FIGS. 7 to 9, the device body 3 includes a control unit 31 (FIGS. 7 to 9), a cooling unit 32 (FIGS. 8 and 9), a disk unit 33 (FIGS. 7 to 9), a power unit 34 (FIGS. 7 to 9), a reader/writer unit 35 (FIGS. 7 to 9) and a plate spring 36 (FIG. 9). The device body 3 is provided by integrally assembling the respective units 31 to 35 and the plate spring 36 with a screw and the like.

The disk unit 33 reads information such as image, video, computer program and the like recorded on the various types of optical disk inserted therein under the control of the below-described control unit 31, and outputs the information to the control board 5 of the control unit 31. The disk unit 33 records the above-described information onto the inserted optical disk.

The disk unit 33 includes a unit body 331 and a metal casing 332 for housing the unit body 331 therein. The casing 332 has an opening 3321 through which a 12 cm-diameter optical disk is inserted on a front side thereof.

The power unit 34 supplies drive power to the device body 3. Specifically, the power unit 34 converts commercial alternating current input into the inlet connector 2247 (FIG. 3) provided on the exterior casing 2 into direct current to raise or lower the voltage to be suitable for the respective electronic components of the device body 3 before supplying to the respective electronic components. The power unit 34 is connected with a power pin 571 (FIG. 18) provided on a below-described control board 5 to supply drive power to the respective electronic components through the control board 5.

The reader/writer unit 35 executes information-reading and information-storing on the various memory cards inserted through the respective openings 21131 provided on the card slot 2113 of the upper casing 21 under the control of below-described control board 5. The reader/writer unit 35 includes a reader/writer 351 to which a memory card is inserted and a board 352 for controlling the operation of the reader/writer 351. The board 352 drives the reader/writer 351 based on a control signal inputted from the control board 5. The reader/writer unit 35 is rigidly supported on a below-described sub-frame 6 of the control unit 31.

(4) Arrangement of Control Unit 31

Figure 10:
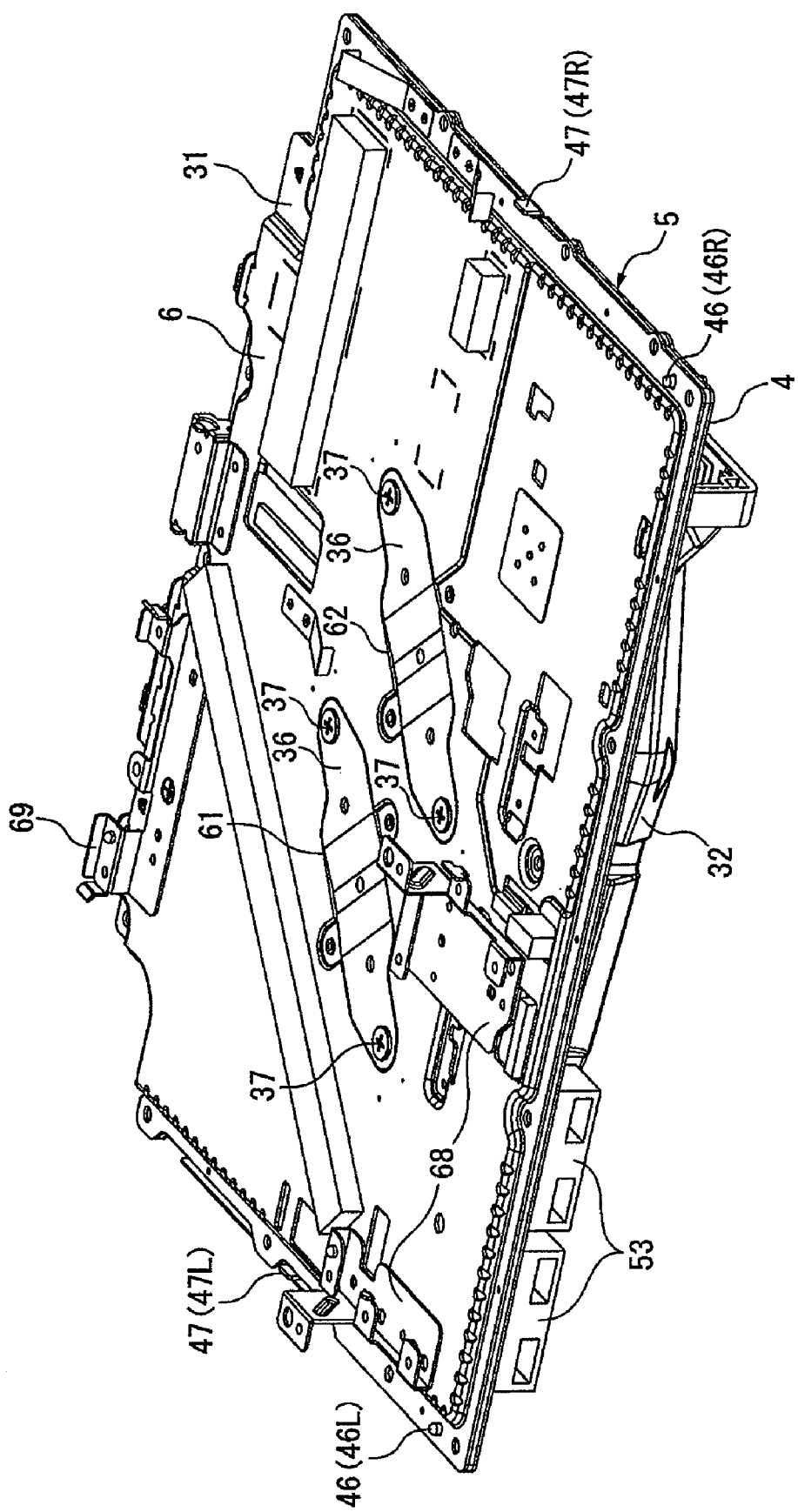
FIG. 10 is a perspective view showing an upper side of a control unit of the embodiment.
Figure 11:
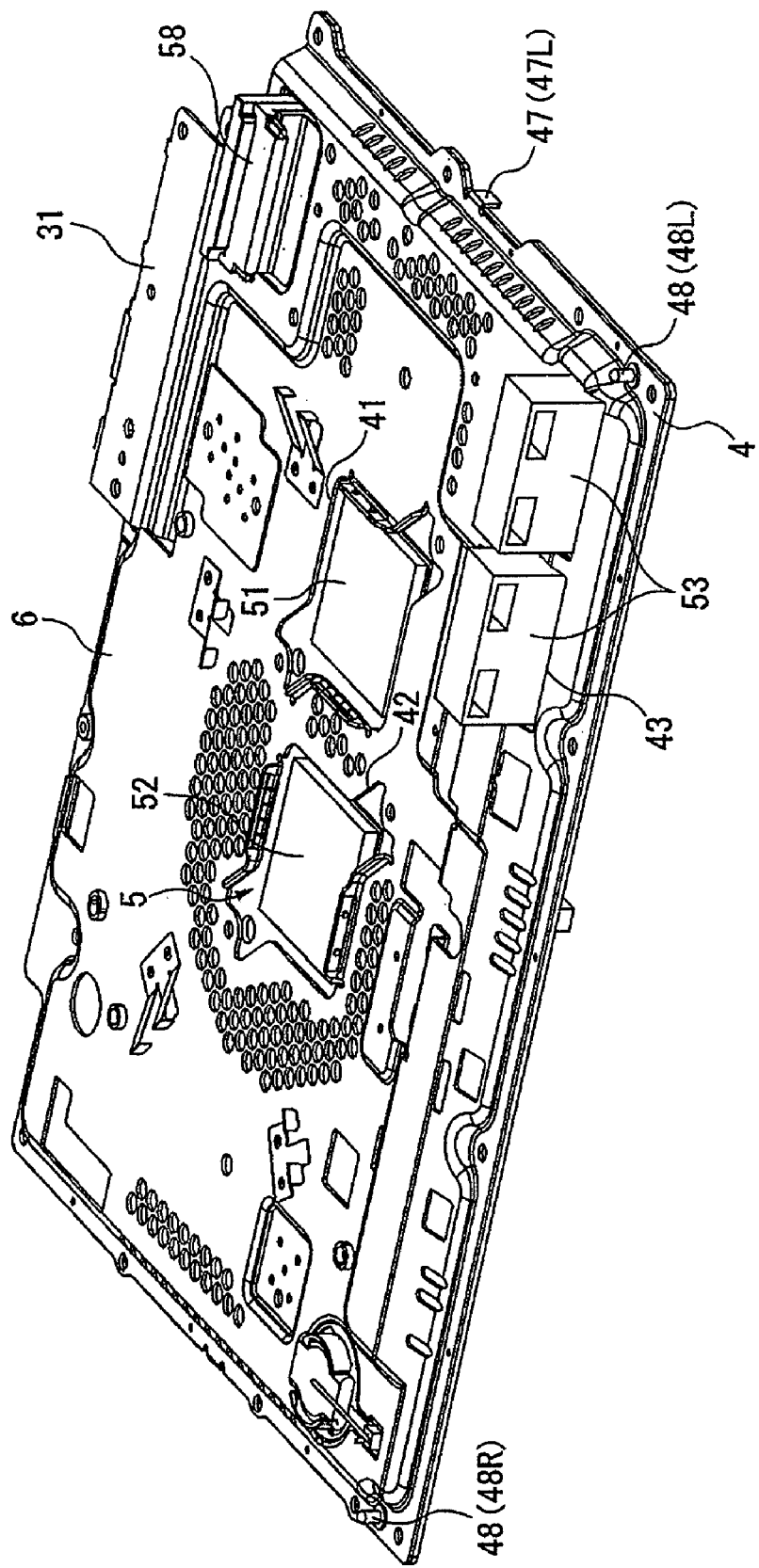
FIG. 11 is a perspective view showing a lower side of the control unit of the embodiment.
Figure 12:
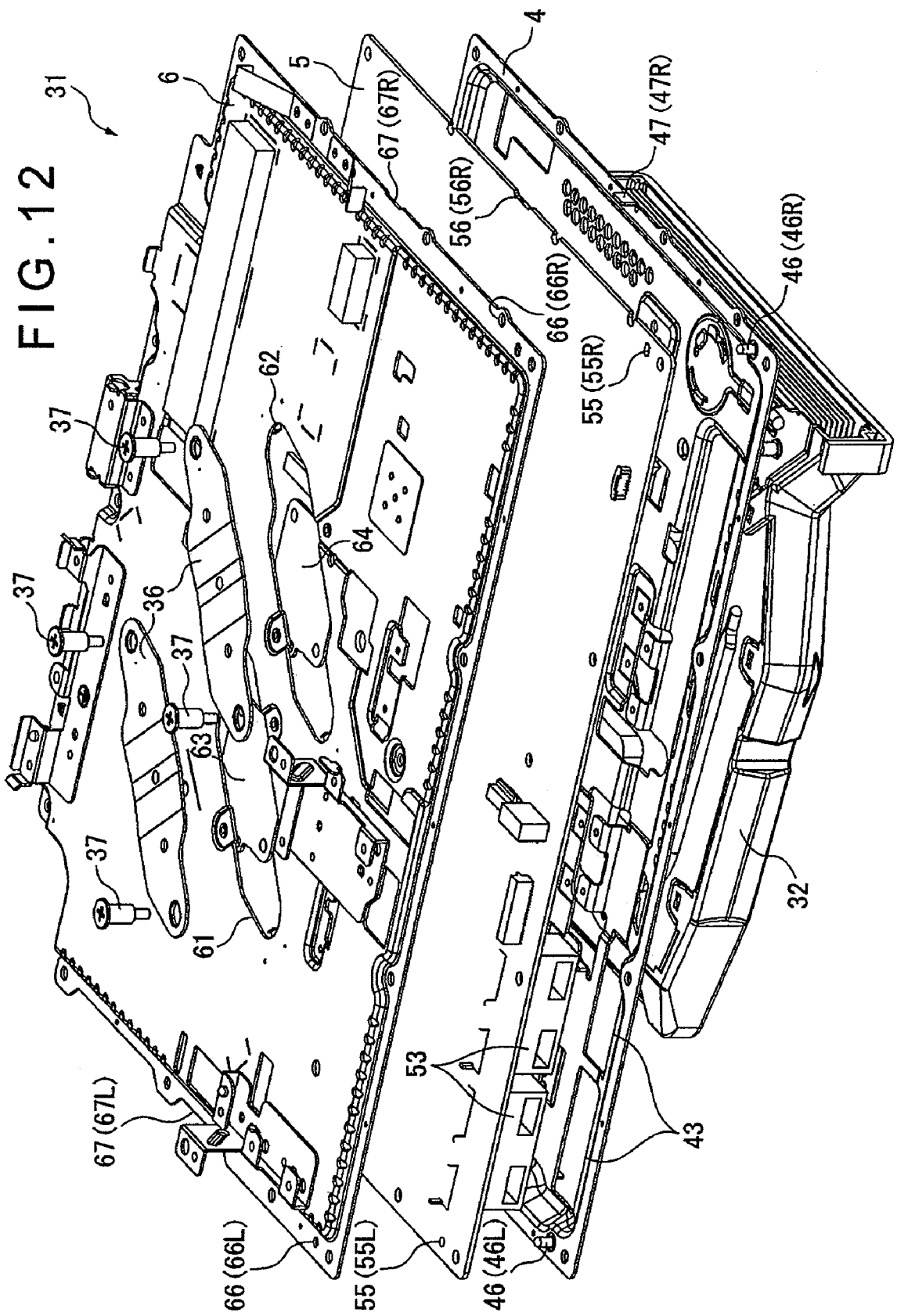
FIG. 12 is an exploded perspective view showing the control unit and a cooling unit of the embodiment.

FIGS. 10 and 11 are perspective views showing upper and lower sides of the control unit 31. FIG. 12 is an exploded perspective view showing the control unit 31 and the cooling unit 32.

The control unit 31 controls the operation of the device body 3 and, consequently, the information processing device 1. As shown in FIGS. 10 to 12, the control unit 31 includes the main-frame 4, the control board 5 and the sub-frame 6. The position of the control board 5 and the sub-frame 6 is accurately adjusted relative to the main-frame 4.

(4-1) Arrangement of Main-frame 4

Figure 13:
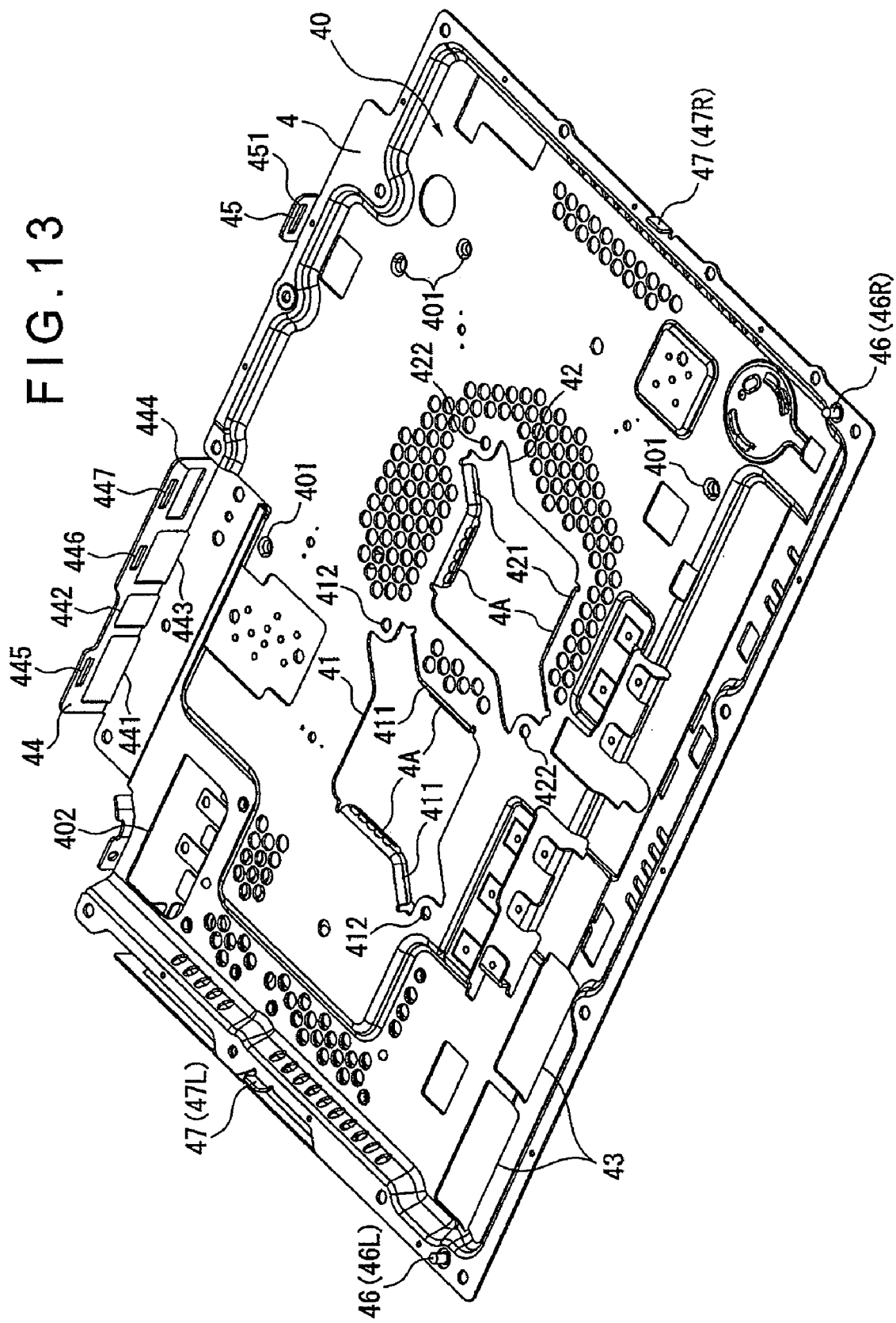
FIG. 13 is a perspective view showing an upper side of a main-frame of the embodiment.

FIGS. 13 and 14 are perspective views showing upper and lower sides of the main-frame 4.

The main-frame 4 (the second frame) is a frame member that sandwiches the control board 5 together with the sub-frame 6, which is coupled with the below-described cooling unit 32. The main-frame 4 is configured in a substantially rectangular (in plan view) plate, which is made of metal such as aluminum considering heat-radiation and EMI (Electro Magnetic Interference). As shown in FIG. 13, the main-frame 4 has a recess 40 that is dented toward the lower side, i.e. away from a side facing the control board 5, at the center thereof. The control board 5 is housed within a space defined by the recess 40 and a recess 60 of the sub-frame 6, where the main-frame 4 is configured so that no contact pressure is applied on various chips disposed on the control board 5 attached to the main-frame 4. Further, the main-frame 4 has a plurality of substantially circular holes, which reduce the weight of the main-frame 4 and send the cooling air to the control board 5 that is held between the main-frame 4 and the sub-frame 6.

The main-frame 4 has two pairs of (total four) pin insertion holes 401 respectively on the rear side (upper side in FIGS. 13 and 14) and the right side (right side in FIG. 13 and left side in FIG. 14: a side near the lateral sides 213 and 222 of the exterior casing 2) of the area on which the recess 40 is provided. More specifically, the two pin insertion holes 401 provided on the rear side of the main-frame 4 are respectively located along the longitudinal direction of the main-frame 4. On the other hand, the two pin insertion holes 401 provided on the right side are located along widthwise direction of the main-frame 4. The pin insertion holes 401 receive a positioning pins 329 provided on the cooling unit 32 when the main-frame 4 is positioned on the below-described cooling unit 32.

The main-frame 4 has juxtaposed openings 41 (left side in FIG. 13), 42 (right side in FIG. 13) that exhibit approximately rectangular shapes in plan view approximately at the center thereof. The openings 41, 42 are provided at a position corresponding to a CPU (Central Processing Unit) 51 and a GPU (Graphics Processing Unit) 52 disposed on the below-described control board 5. The CPU 51 and the GPU 52 are exposed to the lower side of the main-frame 4 through the openings 41, 42. Two pairs of extensions 411, 421 extending downward are respectively provided on two opposing sides of the openings 41, 42. The extensions 411, 422 are provided with a holder piece 4A that holds below-described heat-receiving block 325 of the cooling unit 32 that is in contact with the CPU 51 and the GPU 52 exposed through the openings 41, 42.

Figure 15:
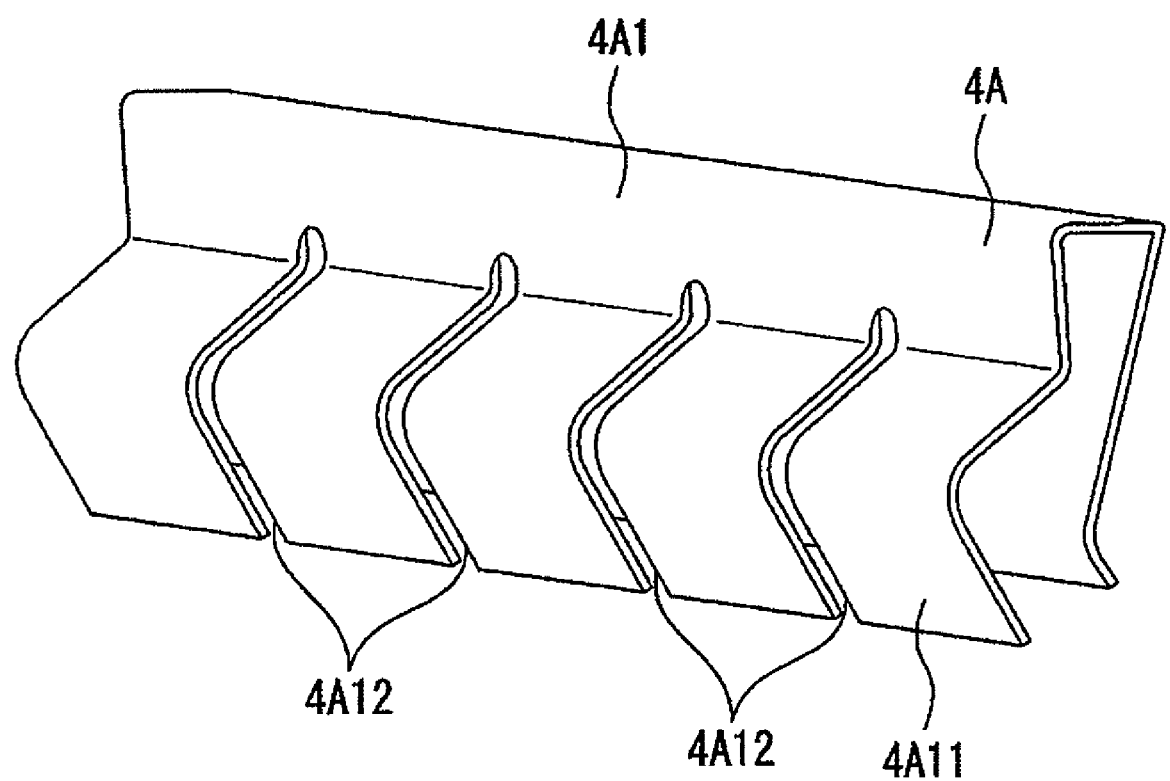
FIG. 15 is a perspective view showing a front side of a holder piece of the embodiment.
Figure 16:
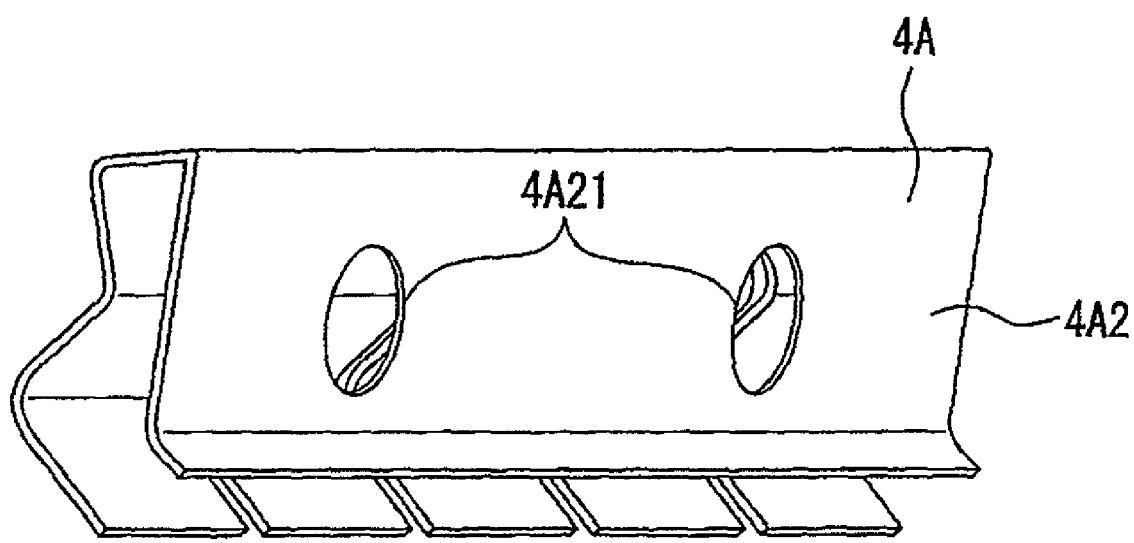
FIG. 16 is a perspective view showing a rear side of the holder piece of the embodiment.
Figure 17:
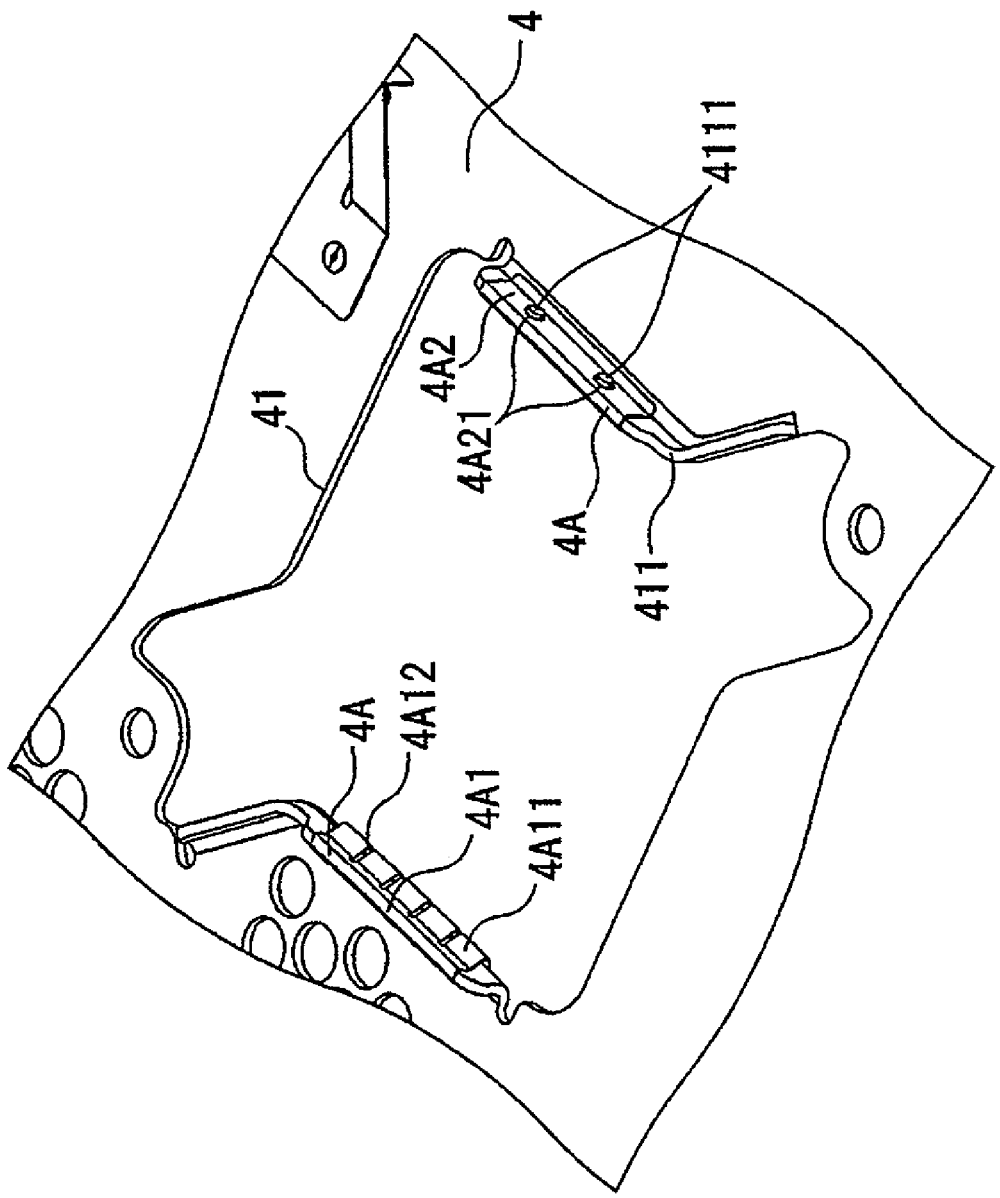
FIG. 17 is a perspective view showing a periphery of an opening of the main-frame of the embodiment.

FIGS. 15 and 16 are perspective views showing front and rear sides of the holder piece 4A. FIG. 17 is a perspective view showing a periphery of the opening 41 of the main-frame 4.

As shown in FIGS. 15 and 16, the holder piece 4A is a metal component of approximately U-shaped cross section, which is attached respectively onto the extensions 411, 421 of the main-frame 4. The holder piece 4A holds the heat-receiving block 325 (FIG. 23) attached at a position of the cooling unit 32 corresponding to the openings 41, 42 of the main-frame 4 when the cooling unit 32 is attached to the control unit 31. Specifically, the holder pieces 4A respectively provided on the pair of extensions 411 formed on the periphery of the opening 41 laterally holds a heat-receiving block 325C disposed within the opening 41. The holder pieces 4A respectively provided on the pair of extensions 421 formed on the periphery of the opening 42 laterally holds a heat-receiving block 325G disposed within the opening 42.

The holder piece 4A is provided with a front section 4A1 that is in contact with the heat-receiving block 325 and a rear section 4A2 that is in contact with the extensions 411, 421.

The front section 4A1 is provided with projections 4A1 of an approximately V-shaped cross section projecting in a direction away from the rear section 4A2. The front section 4A1 is also provided with a plurality of notches 4A12 that divide the projections 4A11. The projections 4A11 are flexible component, which apply biasing force in a direction for pressing the heat-receiving block 325 when the projections 4A1 are in contact with the heat-receiving block 325.

Two approximately circular openings 4A21 are provided on the rear section 4A2. As shown in FIG. 17, projections (only projections 4111 are illustrated in FIG. 17) provided on the extensions 411 and 421 of the main-frame 4 to have approximately the same size and dimension as the openings 4A21 are fitted into the openings 4A21. Accordingly, detachment of the holder piece 4A from the extensions 411 and 421 can be avoided.

By providing the holder piece 4A onto the extensions 411, 421, the heat-receiving block 325 can be securely placed within the openings 41, 42 and the attitude of the heat-receiving block 325 can be stabilized. Further, when the control board 5 is attached to the main-frame 4 and the CPU 51 and the GPU 52 touch the heat-receiving blocks 325C and 325G (FIG. 23), the CPU 51/the GPU 52 are electrically coupled with the main-frame 4 to establish electrical connection between the CPU 51/the GPU 52 and the main-frame 4, thus preventing EMI.

Now returning back to FIGS. 13 and 14, the main-frame 4 has two pairs of holes 412, 422 around the openings 41, 42. Specifically, the two holes 412 are provided on one of the diagonal lines of the approximately rectangular opening 41. The two holes 422 are provided on one of the diagonal lines of the approximately rectangular opening 42. The holes 412, 422 receive screws 37 (FIG. 12) for attaching the cooling unit 32 to the control unit 31.

Approximately rectangular openings 43 are juxtaposed on a front side (near side in FIGS. 13 and 14) of the main-frame 4. The openings 43 receive two terminal connectors 53 (FIG. 19) provided on the control board 5 when the control board 5 is mounted on the main-frame 4.

Lateral sides 44 and 45 of approximately L-shaped cross section are provided upright on an end of the rear side (upper side in FIG. 13) of the main-frame 4.

The lateral side 44 on the left side in FIG. 13 is provided with four openings 441 to 444 of different dimension. The openings 441 to 444 receive the terminals 59 (FIG. 19) provided on the control board 5 and exposed from the openings 2241 to 2244 provided on the lower casing 22. Further, approximately rectangular elongated openings 445 to 447 are provided on the lateral side 44 above the openings 441, 443 and 444. Further, the lateral side 45 provided on the right side in FIG. 13 has an opening 451 similar to the openings 445 to 447. A rising portion 65 provided on the sub-frame 6 is engaged with the openings 445 to 447 and 451 to attach the sub-frame 6 to the main-frame 4.

As shown in FIG. 13, the upper side of the main-frame 4 is provided with pins 46 projecting in an out-plane direction (the pin on the right side of the main-frame 4 is referenced as 46R and the pin on the left side is referenced as 46L) are provided on both longitudinal end near the front side thereof. The pins 46 are positioning pins used to position the control board 5 and the sub-frame 6 when these components are mounted onto the main-frame 4.

Further, the main-frame 4 is provided with rising portions 47 (the rising portion on the right side of the main-frame 4 is referenced as 47R and the rising portion on the left side of the main-frame 4 is referenced as 47L) of approximately L-shaped cross section respectively rising approximately at the center of widthwise ends of the upper side thereof. The rising portions 47 guides the positioning by holding approximate center of the widthwise ends of the control board 5 and the sub-frame 6 when the control board 5 and the sub-frame 6 are positioned on the main-frame 4.

As shown in FIG. 14, pins 48 projecting in an out-plane direction (the pin on the right side of the main-frame 4 is referenced as 48R and the pin on the left side is referenced as 48L) are provided on the lower side of the main-frame 4 at a position corresponding to the pin 46. The pins 48 are fitted into the fitting holes 2261 and 2262 (FIG. 6) provided on the lower casing 22 to position the main-frame 4 to the lower casing 22.

The main-frame 4 is provided with an approximately rectangular opening 402 on the left (left side in FIG. 13, which is a side near the lateral side 223 of the lower casing 22) near the rear side thereof. The main-frame 4 has an HDD attachment 49 for an HDD unit (not shown) to be attached on the lower side (right side in FIG. 14) of a part provided with the opening 402. The HDD attachment 49 is configured in an approximately rectangular parallelepiped and has a plurality of holes for introducing cooling air on the surface thereof. The HDD attachment 49 has an approximately rectangular opening 4911 on the left side (a side near the lateral side 223 (FIG. 3) of the lower casing 22: right side in FIG. 14) thereof. The HDD unit is housed within the HDD attachment 49 through the opening 4911 and the opening 2232 provided on the lateral side 223 of the lower casing 22. When a connector 58 (FIG. 11) exposed into the HDD attachment 49 through the opening 402 is connected with a terminal of the HDD unit, information can be read from or recorded on the HDD unit under the control of the control board 5.

(4-2) Arrangement of Control Board 5

Figure 18:
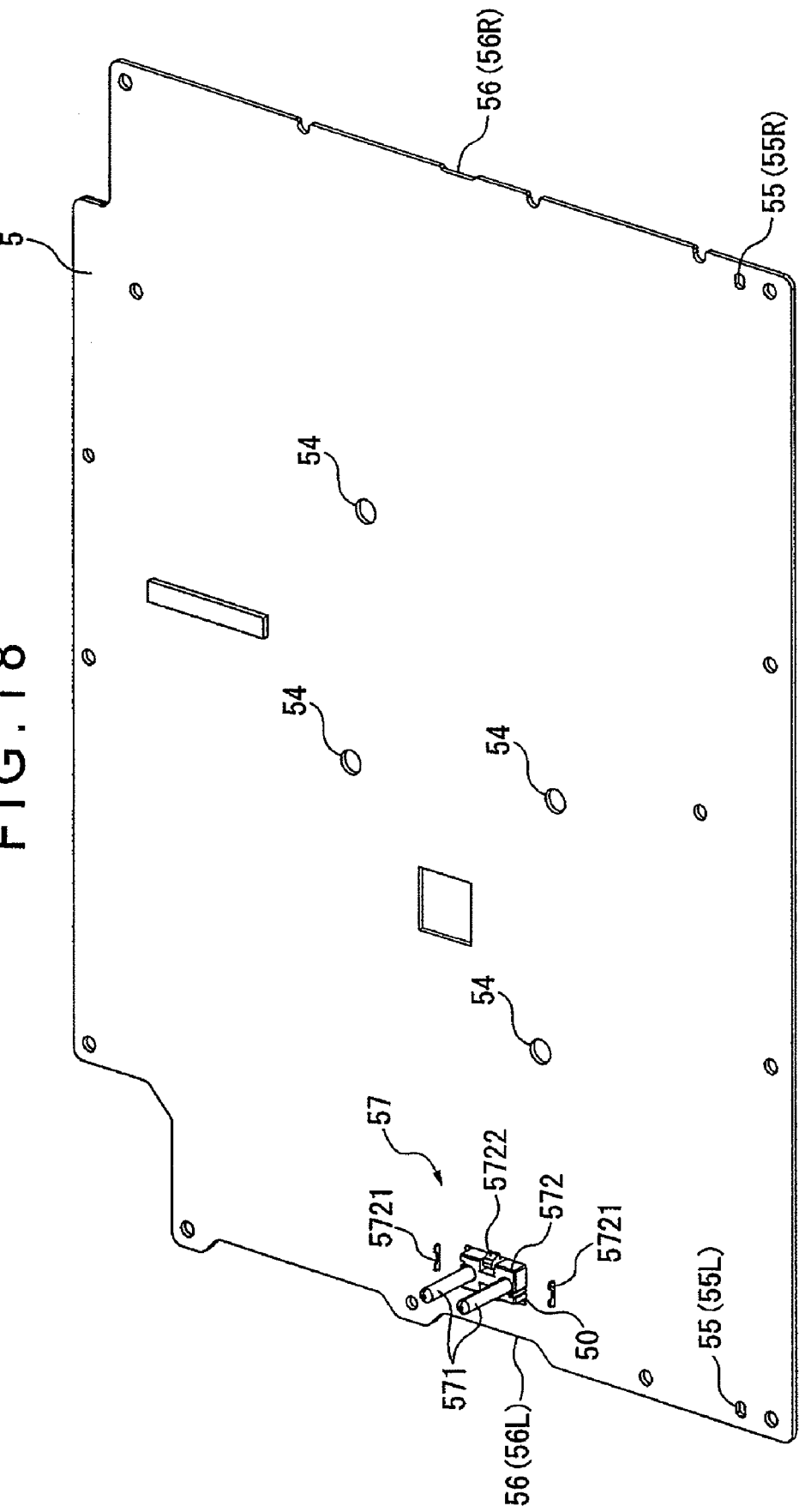
FIG. 18 is a perspective view showing an upper side of a control board of the embodiment.
Figure 19:
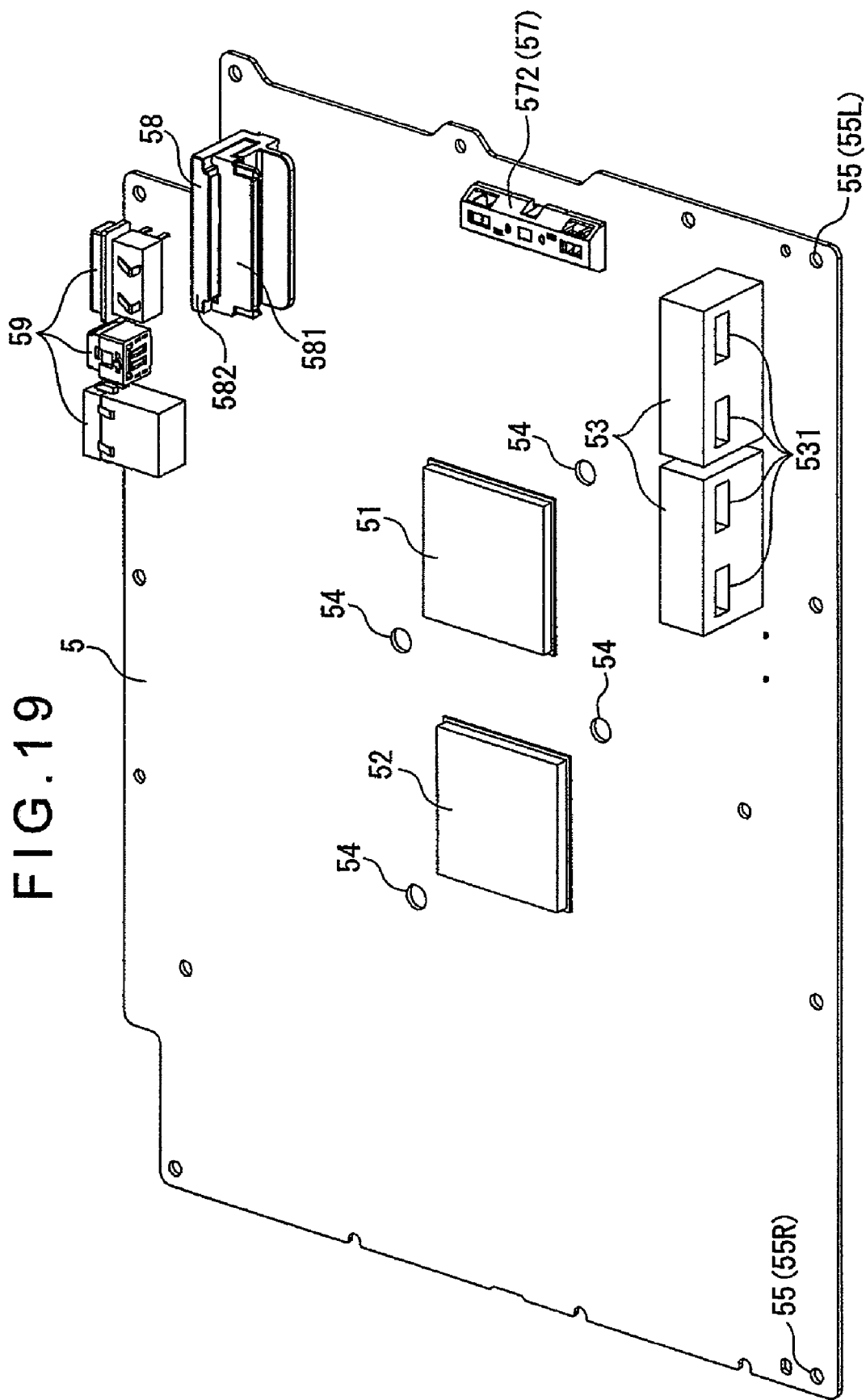
FIG. 19 is a perspective view showing a lower side of the control board of the embodiment.

FIGS. 18 and 19 are perspective views showing upper and lower sides of the control board 5.

The control board 5 controls the device body 3 and, consequently, the entire information processing device 1. The control board 5 is a circuit board provided with various IC (Integrated Circuits) chips including the CPU 51 (right side in FIG. 19) and the GPU 52 (left side in FIG. 19) approximately at the center thereof as well as, though not specifically illustrated, RAM (Random Access Memory), ROM (Read Only Memory), and a chip set mounted thereon. The control board 5 is placed so that the side on which various IC chips including the CPU 51 and the GPU 52 (i.e. the lower side on which the casings of the various IC chips are disposed) is opposed to the main-frame 4 and the upper side on which terminals of elements such as resisters are opposed to the sub-frame 6. The terminals of the CPU 51 and the GPU 52 are provided on the lower side of the control board 5 and are attached to sockets 511, 521 (FIG. 26) that are connected with the terminals of the CPU 51 and the GPU 52. The sockets 511, 521 are sized slightly larger (in plan view) than the CPU 51 and GPU 52.

As shown in FIGS. 18 and 19, the control board 5 has four holes 54 for the screw 37 (FIG. 12) for fixing the control unit 31 and the cooling unit 32 approximately at the center thereof, more specifically, on one of the diagonal lines of the CPU 51 and the GPU 52. The four holes 54 are disposed at positions corresponding to the holes 412, 422 provided around the openings 41, 42 of the main-frame 4. The control board 5 has holes 55 (a hole on the right side of the control board 5 is referenced as 55R and a hole on the left side is referenced as 55L) on both longitudinal ends of the front side thereof. The holes 55R and 55L respectively receive the pins 46R and 46L provided on the main-frame 4 to position the control board 5 on the main-frame 4.

The control board 5 has notches 56 (a notch on the right side of the control board 5 is referenced as 56R and a notch on the left-side is referenced as 56L) recessed toward the center of the control board 5 approximately at the center of the widthwise ends thereof, i.e. at a position corresponding to the rising portion 47 of the main-frame 4. The notches 56 are arranged to be positioned inside the rising portions 47R and 47L when the control board 5 is positioned relative to the main-frame 4, thus restricting the displacement of the control board 5 on the main-frame 4.

The control board 5 is provided with an approximately rectangular opening 50 on the left side (in FIG. 18) thereof, into which a power connector terminal 57 is fitted from the lower side. The power connector terminal 57 includes a pair of power pins 571 (FIG. 18) inserted into the power unit 34 and a casing 572 (FIG. 19) for attaching the power pins 571 to the control board 5. The power connector terminal 57 is attached from the lower side of the control board 5 so that the power pins 571 project toward the upper side of the control board 5.

Though not illustrated in detail, the pair of power pins 571 respectively have an approximately S-shaped configuration, one end of which is cylindrically arranged and is projected to the outside of the casing. With this configuration, the pair of power pins 571 are displaceable within the casing 572, which ensures proper insertion of the power pin 571 to the power unit 34 disposed on the sub-frame 6 even when some dimensional error occurs in manufacturing the power unit 34.

The casing 572 has projections 5721 on both of the longitudinal ends thereof to be exposed on the upper side of the control board 5, which are soldered to the control board 5 in attaching the power connecter terminal 57 to the control board 5. Since the upper side of the control board 5 on which the projections 5721 project is the side on which terminals of various elements such as the resistors are exposed, the attachment process of the power connecter terminal 57 can be conducted on the same plane as the other elements. Accordingly, attaching work of the power connector 57 to the control board 5 can be facilitated and the manufacturing process of the information processing device 1 can be simplified. Further, as shown in FIG. 18, the casing 572 is provided with an engaging claw 5722 that is in contact with the periphery of the opening 50 to prevent the casing 572 from being detached downward (i.e. in a direction opposite to the attaching direction of the casing 572).

As shown in FIG. 19, the control board 5 has two terminal connectors 53 respectively having two USB terminals 531 juxtaposed on the front side (near side in FIGS. 18 and 19) of the lower side thereof. The terminal connectors 53 are inserted into the opening 43 when the control board 5 is attached to the main-frame 4. The USB terminals 531 of the terminal connector 53 are exposed through the opening 2211 of the lower casing 22. The USB terminals 531 are arranged so that A-terminal compatible with USB standard can be inserted therein.

Provided on the lower side (i.e. a side facing the main-frame 4) of the control board 5 are: connector 58 exposed through the opening 402 (FIG. 13) to be connected with the HDD unit (not shown); and various terminals 59 exposed through the openings 441 to 444 provided on the lateral side 44 and the openings 2241 to 2244 provided on the rear side 224 and the like.

The connector 58 includes a connecting unit 581 to be connected with the terminal provided on the HDD unit and a casing 582 that supports the connecting unit 581.

The connecting unit 581 has an approximately L-shaped side section, one end of which projects from the casing 582 along the lower side of the control board 5. Terminals (not shown) provided within the connecting unit 581 and the terminals of the HDD unit are connected through openings (not shown) provided on the projecting end. The connecting unit 581 is displaceable relative to the casing 582 in a direction opposite to the projecting direction and in a direction substantially orthogonal to the projecting direction. Accordingly, even when the terminal of the HDD unit is not aligned with the connecting unit 581, the connecting unit 581 is displaced to ensure secure insertion of the terminal into the connecting unit 581.

(4-3) Arrangement of Sub-Frame 6

Figure 20:
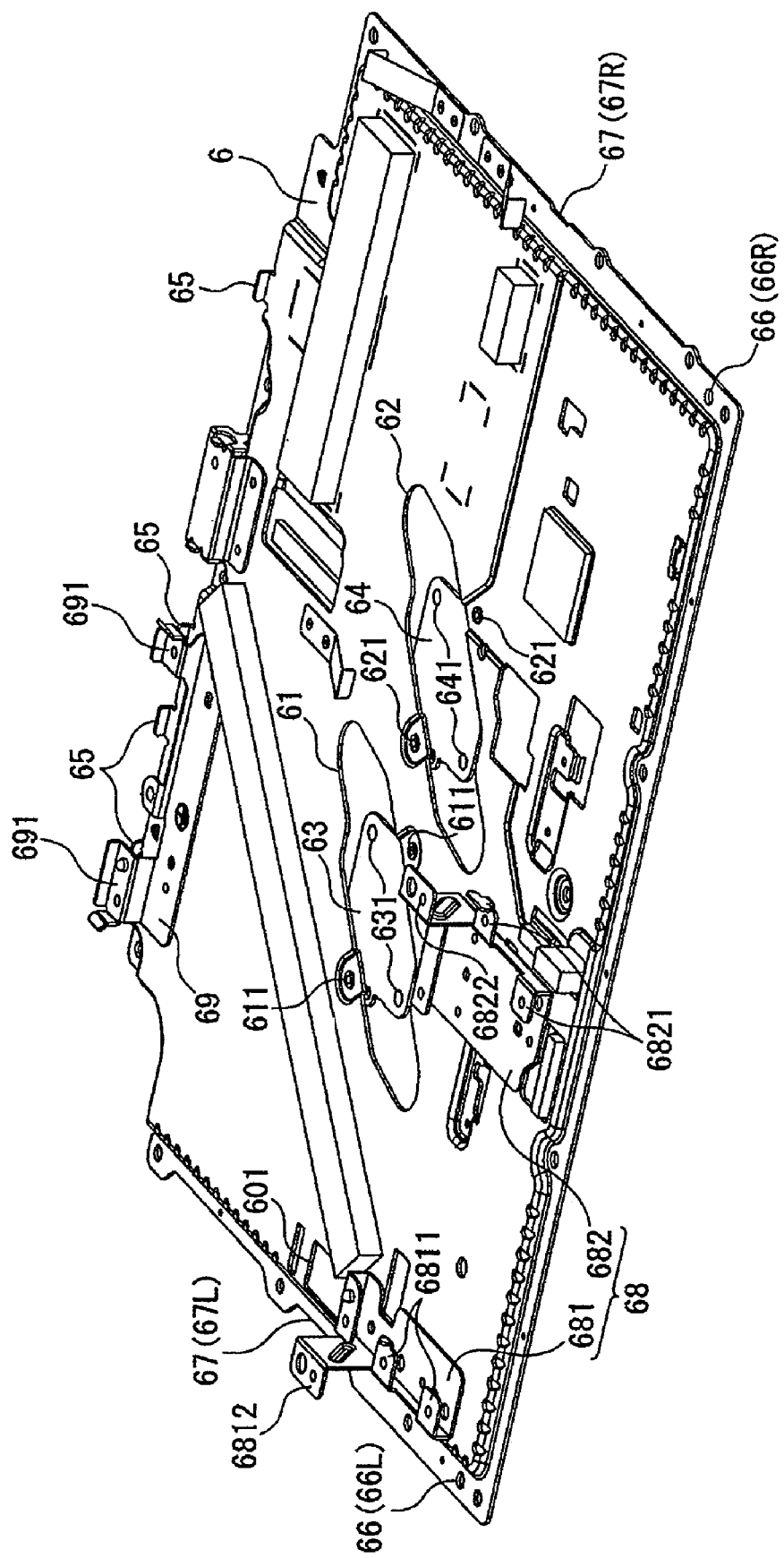
FIG. 20 is a perspective view showing an upper side of a sub-frame of the embodiment.
Figure 21:
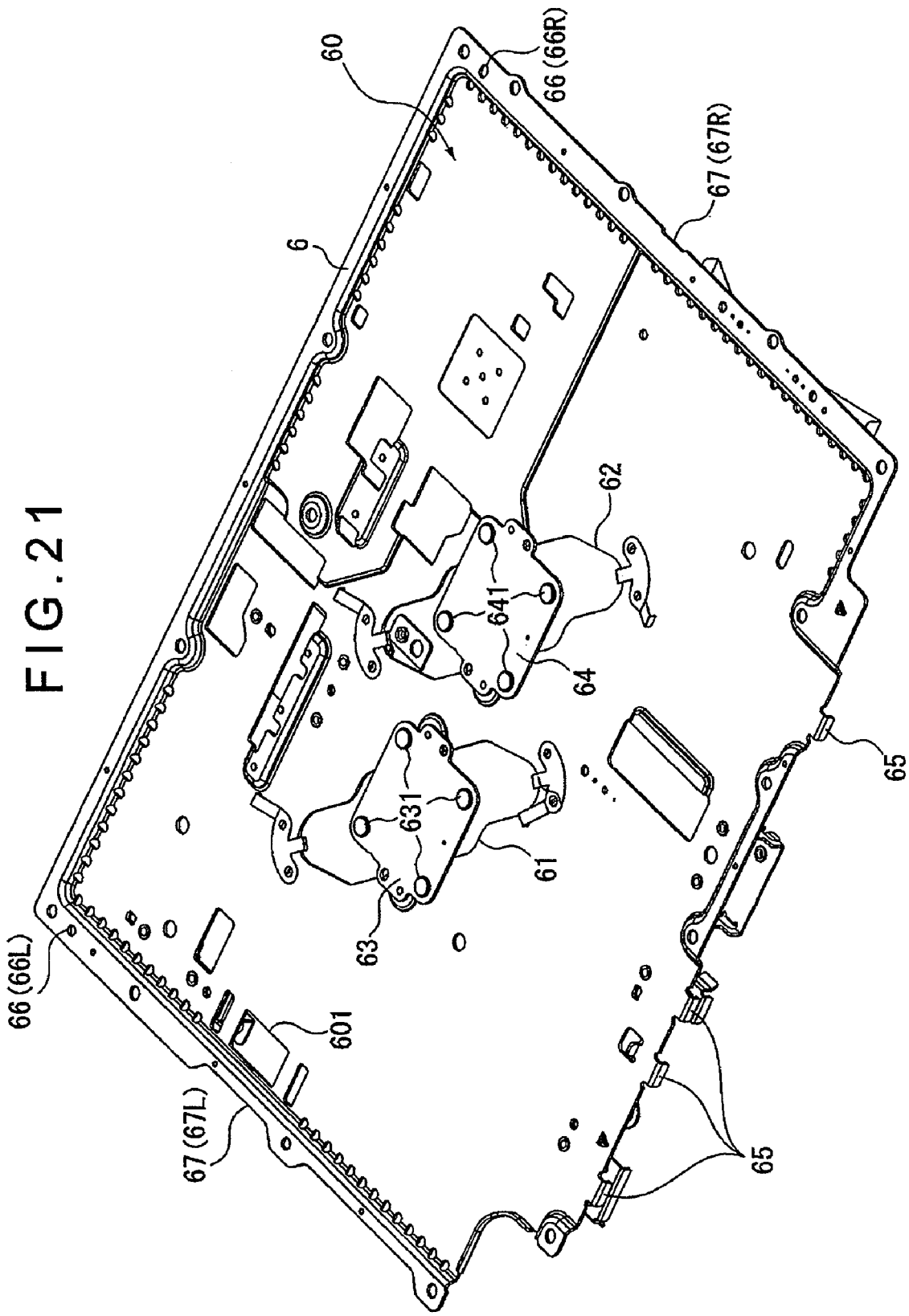
FIG. 21 is a perspective view showing a lower side of the sub-frame of the embodiment.

FIGS. 20 and 21 are perspective views showing upper and lower sides of the sub-frame 6.

The sub-frame 6 (first frame member) is a frame member that supports the control board 5 together with the main-frame 4 and also supports the disk unit 33, the power unit 34 and the reader/writer unit 35. The sub-frame 6 is made of metal such as aluminum considering heat-radiation and EMI as in the main-frame 4. As shown in FIGS. 20 and 21, the sub-frame 6 is an approximately rectangular plate and is provided with a recess 60 dented away from the side facing the control board 5 approximately at the center thereof. As described above, the control board 5 is housed within the space defined by the recess 60 and the recess 40.

Approximately oblong openings 61 (left side in FIG. 20), 62 (right side in FIG. 20) are provided approximately at the center of the sub-frame 6. The openings 61 and 62 are provided at a position corresponding to the CPU 51 and the GPU 52 when the control board 5 is held by the sub-frame 6 and the main-frame 4. Further, the openings 61, 62 are configured in a shape corresponding to the below-described plate spring 36 for attaching the cooling unit 32 onto the control unit 21.

Approximately square (in plan view) plate bodies 63 and 64 sized corresponding to the CPU 51 and the GPU 52 are respectively provided inside the openings 61, 62. The plate bodies 63, 64 are made of rigid metal such as steel, which are attached to the lower side of the sub-frame 6 by screws 611, 622 screwed into threaded holes (not shown) provided around the openings 61, 62 to cover the center of the openings 61 and 62. The plate bodies 63, 64 are provided at a position corresponding to the CPU 51 and the GPU 52 when the sub-frame 6 is attached to the main-frame 4 to cover the control board 5.

The plate bodies 63, 64 are provided with cylindrical projections 631, 641 on four corners thereof to penetrate therethrough. As shown in FIG. 21, a part of the projections 631, 641 projects to the lower side (a side facing the control board 5: the side shown in FIG. 21) of the sub-frame 6. The projections 631, 641 are in contact with the control board 5 at a backside of a mount side of the CPU 51 and the GPU 52 at a location opposite to the location of the CPU 51 and the GPU 52. The projections 631, 641 are made of, for instance, insulative synthetic resin such as acetal resin, which prevents transmission of the electric current flowing in the control board 5 to the plate spring 36 through the plate bodies 63, 64 when the sub-frame 6 covers the control board 5. Since the projections 631, 641 are provided on the four corners of the lower side of the plate bodies 63, 64, the pressing force of the cooling unit 32 toward the heat-receiving blocks 325C, 325G (FIG. 23) applied by the plate spring 36 can be uniformly transmitted to the CPU 51 and the GPU 52.

As shown in FIGS. 20 and 21, the sub-frame 6 has a plurality of upwardly rising portions 65 on the rear end thereof. The rising portions 65 are respectively provided at a position corresponding to the openings 445 to 447 and 451 (FIG. 13). The rising portions 65 are respectively inserted into the openings 445 to 447 and 451, thereby attaching the sub-frame 6 to the main-frame 4.

On both of the longitudinal ends of the front side of the sub-frame 6, holes 66 (the hole on the right side of the sub-frame 6 is referenced as 66R and the hole on the left side is referenced as 66L) for receiving the pins 46 (FIG. 13) provided on the main-frame 4 when the sub-frame 6 is attached to the main-frame 4 is provided.

Further, the sub-frame 6 has notches 67 (the notch on the right side of the sub-frame 6 is referenced as 67R and the hole on the left side is referenced as 67L) similar to the notches 56 (FIG. 18) are provided approximately at the center of the widthwise ends thereof. The notches 67 receives the rising portion 47 when the sub-frame 6 is positioned onto the main-frame 4 after positioning the control board 5 relative to the main-frame 4, thereby guiding the position of the main-frame 4 relative to the sub-frame 6. Incidentally, the sub-frame 6 has an approximately rectangular opening 601 for receiving the power pin 571 (FIG. 18) of the power connector terminal 57, which is located to the middle of the sub-frame 6 relative to the notch 67L.

Further, the sub-frame 6 has a base member 68 for supporting the reader/writer unit 35 (FIG. 9) on the left front side of the upper side thereof as shown in FIG. 20. The base member 68 includes a left base 681 disposed on the left side and a right base 68 disposed on the right side. The bases 681, 682 are provided with extensions 6811, 6821 extending approximately in parallel with the upper side of the sub-frame 6 and extensions 6812, 6822 extending approximately in parallel to and located remote from the upper side of the sub-frame 6 relative to the extensions 6811, 6821. The extensions 6811, 6821 support the board 352 and the extensions 6812, 6822 support the reader/writer 351.

A support unit 69 for supporting the power unit 34 is provided on the rear left side of the upper side of the sub-frame 6 along the rear end. The support unit 69 is an approximately rectangular component (in plan view), both longitudinal ends of which vertically rise from the upper side of the sub-frame 6 and the tip ends of the vertically rising portions extend approximately in parallel to the upper side. The power unit 34 (FIG. 9) is mounted on extensions 691 that extend approximately in parallel and is fixed onto the support unit 69 with a screw (not shown).

(5) Arrangement of Cooling Unit 32

Figure 22:
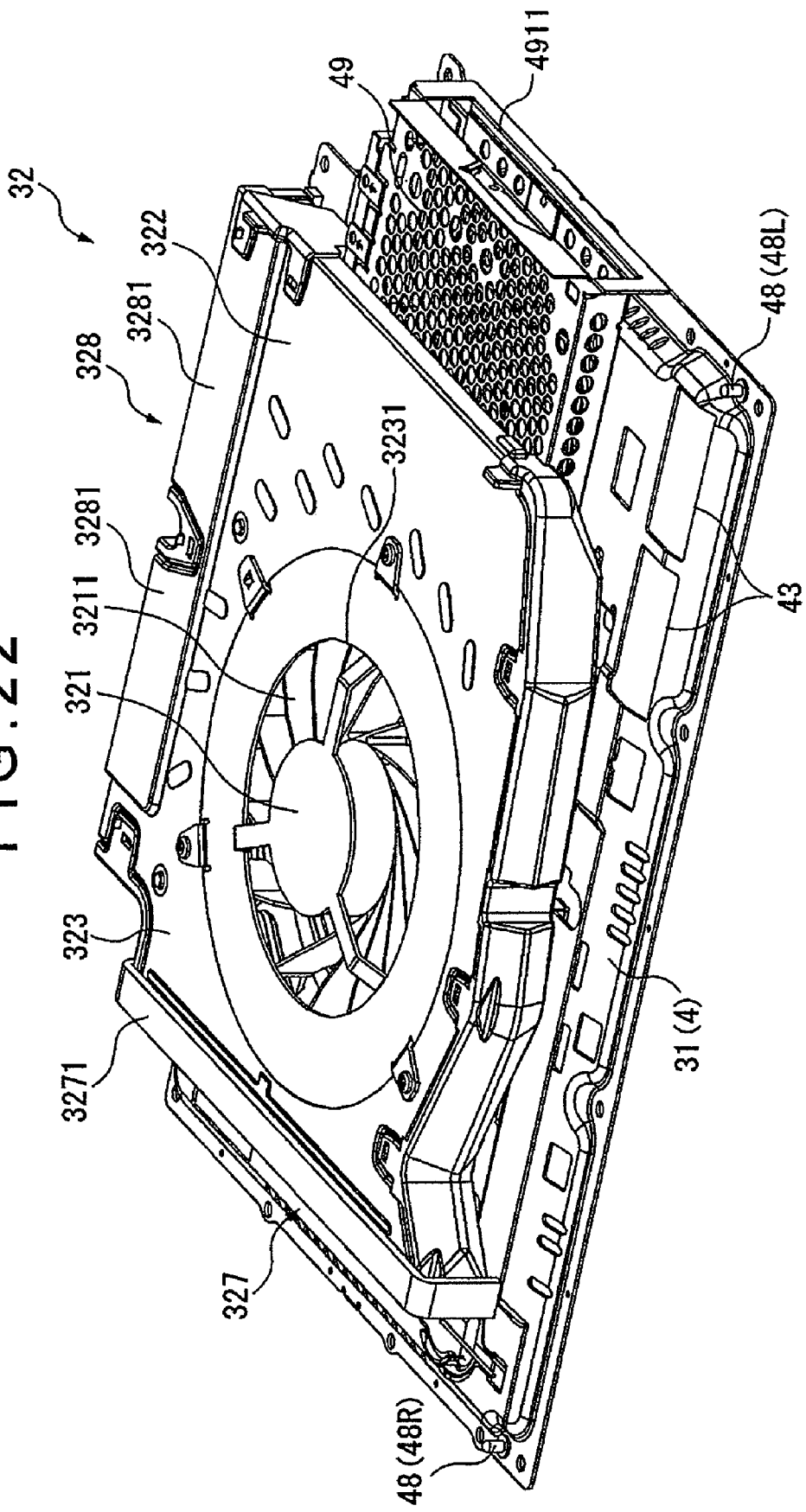
FIG. 22 is a perspective view showing a lower side of the control unit and the cooling unit of the embodiment.
Figure 23:
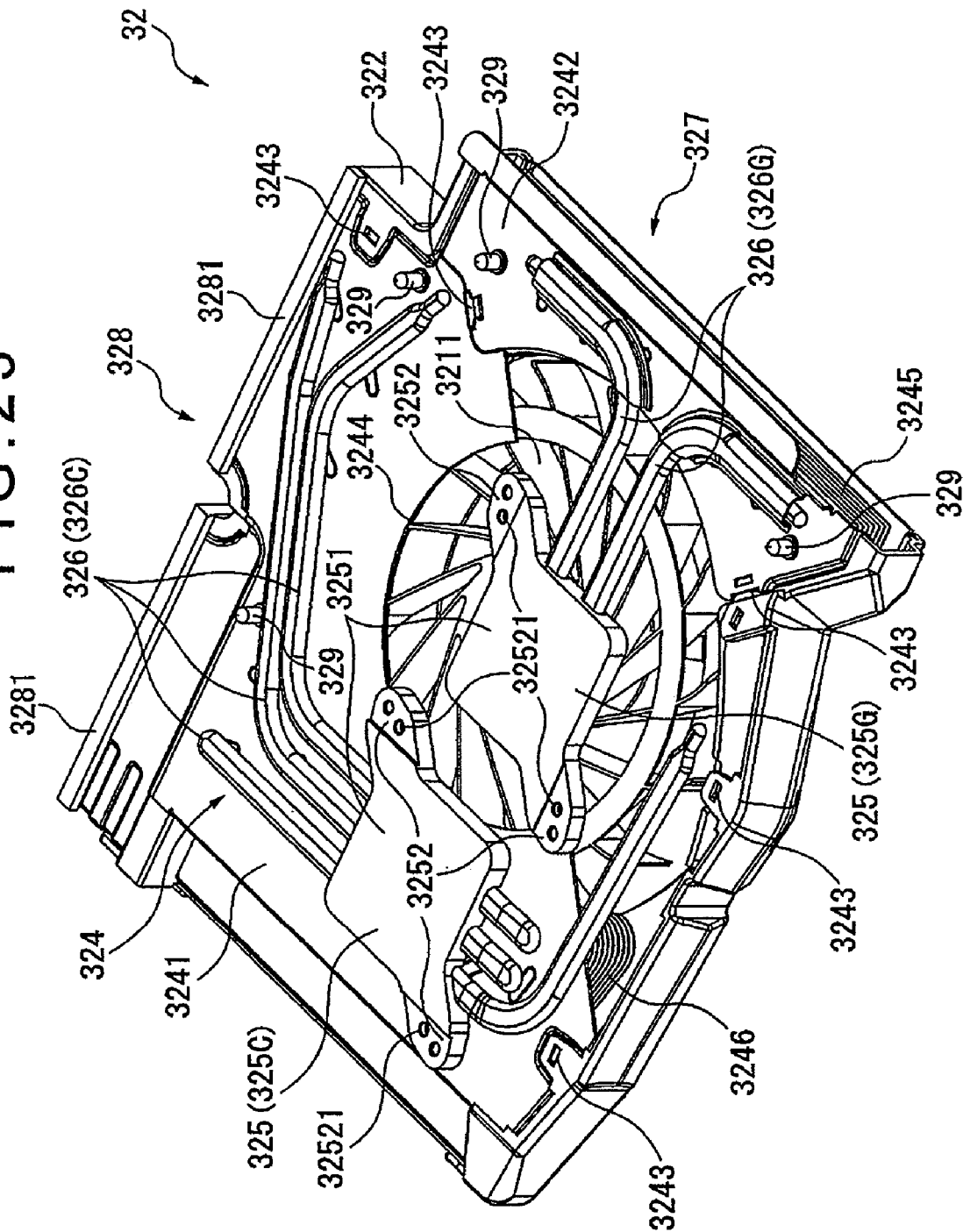
FIG. 23 is a perspective view showing an upper side of the cooling unit of the embodiment.

FIG. 22 is a perspective view showing a lower side of the cooling unit 32 assembled with the control unit 31. FIG. 23 is a perspective view showing the upper side of the cooling unit 32.

As described above, the cooling unit 32 is integrated with the control unit 31 by the plate spring 36 to cool the control board 5 of the control unit 31. In addition, the cooling unit 32 cools the power unit 34 and the like located on the flow-path of the cooling air in the course of introducing the cooling air from the outside of the exterior casing 2. As shown in FIG. 22, the cooling unit 32 is disposed so that a part of the cooling unit 32 covers the HDD attachment 49 of the main-frame 4.

The cooling unit 32 includes an air blower 321 provided with vane 3211 radially provided on the rotary shaft and a motor (not shown) for rotating the rotary shaft and the vanes 3211, and a housing 322 for accommodating the air blower 321 thereinside.

The air blower 321 sucks the air outside the housing 322 by the vane 3211 rotated in accordance with the rotation of the rotary shaft through below-described air intakes 3231, 3244 provided on the housing 322, and discharges the sucked air through discharge ports 327 and 328. The cooling air delivered by the rotation of the rotary shaft and the vane 3211 dissipates the heat transferred to heat-radiation fins 3245, 3246 through the heat-radiation block 325.

The housing 322 is a rectangular parallelepiped component, which is made of metal such as aluminum for enhancing heat radiation and strength.

As shown in FIG. 22, the housing 322 has an approximately circular (in plan view) air intake 3231 is provided on a lower side 323 (i.e. a side facing the lower casing 22) thereof. The cooling air introduced into the exterior casing 2 through the air intakes 2212 provided on the lower casing 22 is attracted to the air intake 3231.

As shown in FIG. 23, an upper side 324 (i.e. a side facing the control unit 31) of the cooling unit 32 is provided by two plate members 3241, 3242. The plate members 3241, 3242 are attached to the housing 322 so as to allow slight up-down movement by a plurality of attachments 3243.

Approximately at the center of the upper side 324, an approximately circular (in plan view) air intake 3244 is provided to stretch between the two plate members 3241 and 3242. The cooling air after cooling the device body 3 is introduced into the cooling unit 32 through the air intake 3244 in accordance with the rotation of the vane 3211 of the air blower 321.

Inside the housing 322, heat-radiation fins 3245, 3246 respectively connected to the plate bodies 3241, 3242 to radiate the heat transferred to the plate bodies 3241, 3242 are provided. More specifically, the heat-radiation fin 3246 is connected to the plate member 3241 and the heat-radiation fin 3245 is connected to the plate member 3242. The heat-radiation fins 3245, 3246 are provided by a plurality of thin metal plates coupled with each other to form a layered structure. The heat-radiation fins 3245, 3246 is cooled by the air sucked into the housing 322 in accordance with the rotation of the vane 3211 and delivered to the heat-radiation fins 3245, 3246. At this time, since the cooling air is distributed between the thin metal plates of the heat-radiation fins 3245, 3246, the cooling air can be rectified. Incidentally, the heat-radiation fin 3245 and the heat-radiation fin 3246 are separately provided to be thermally independent.

The upper side 324 is provided thereon with two heat-receiving blocks 325 (325C, 325G). The heat-receiving blocks 325 (heat-receiving portion of the present invention) are metal components with high heat-conductivity, which are configured in a shape corresponding to the openings 41, 42 formed on the main-frame 4. The heat-receiving blocks 325 has an approximately rectangular (in plan view) flat portions 3251 approximately at the center thereof and step portions 3252 lower than the flat portion 3251 on both ends thereof sandwiching the flat portions 3251.

Threaded holes 32521 are provided on the step portion 3252. The screw 37 (FIG. 12) inserted through the hole 3632 (FIG. 24) of the below-described plate spring 36, the hole 54 (FIG. 18) of the control board 5 and the holes 412, 422 of the main-frame 4 is screwed into the threaded hole 32521 to attach the cooling unit 32 onto the control unit 31. In other words, the threaded hole 32521 works as an engaging portion for engaging the screw 37 (attachment).

Among the heat-radiation blocks 325, the heat-receiving block 325C (on the left side in FIG. 23) is provided at a position partially covering the air intake 3244 and corresponding to the CPU 51. When the cooling unit 32 is attached to the control unit 31, the flat portion 3251 of the heat-receiving block 325C abuts to the CPU 51 to transfer the heat generated by the CPU 51 to the heat-receiving block 325C.

The heat-receiving block 325G (on the right side in FIG. 23) is provided at a position covering a part of the air intake 3244/the plate member 3242 and corresponding to the GPU 52. When the cooling unit 32 is attached to the control unit 31, the flat portion 3251 of the heat-receiving block 325G abuts to the GPU 52 to transfer the heat generated by the GPU 52 to the heat-receiving block 325G.

Grease for reducing thermal resistance is applied on a surface of the flat portions 3251 of the heat-receiving blocks 325C, 325G opposing and abutting to the CPU 51 and the GPU 52. The grease assists heat transfer of the CPU 51 and the GPU 52 to the heat-receiving blocks 325. Incidentally, heat-conductive sheet may be attached instead of grease. However, grease is preferably be employed in order to keep the height of the heat-receiving blocks 325C, 325G.

The heat-receiving blocks 325C, 325G are respectively disposed at different heights in the cooling unit 32. Specifically, the heat-receiving block 325C is located higher than the heat-receiving block 325G. This is because the casing of the CPU 51 is smaller than that of the GPU 52, which requires higher location of the heat-receiving block 325C to be in contact with the CPU 51 than the heat-receiving block 325G. Accordingly, the heat-receiving blocks 325C, 325G can be pressed onto the CPU 51 and the GPU 52 by approximately the same pressure. Further, among the plate members 3241, 3242 to which the heat-receiving blocks 325C, 325G are connected, the plate member 3242 on which the heat-receiving block 325G is placed is capable of up-down movement as described above, which allows adjustment of the height of the heat-receiving block 325G relative to the heat-receiving block 325C.

Accordingly, the heat-receiving blocks 325C, 325G can be securely brought into contact with the CPU 51 and the GPU 52.

The heat-receiving blocks 325 are connected a plurality of heat pipes 326 (326C, 326G) extending along the upper side 324.

Among the heat pipes 326, three heat pipes 326C connect the heat-receiving block 325C with the plate member 3241 to absorb the heat of the CPU 51 transferred to the heat-receiving block 325C to transfer the heat to the plate member 3241. On the other hand, two heat pipes 326G connect the heat-receiving block 325G with the plate member 3242 to absorb the heat of the GPU 52 transferred to the heat-receiving block 325G to transfer the heat to the plate member 3242.

The heat of the CPU 51 and the GPU 52 transferred to the plate members 3241, 3242 are respectively transferred to the heat-radiation fins 3246, 3245, and the heat is cooled by the cooling air distributed in accordance with the rotation of the rotary shaft and the vane 3211 of the air blower 321.

Between the heat-receiving block 325 and the main-frame 4, the holder piece 4A (FIGS. 15 to 17) is disposed when the cooling unit 32 is attached onto the control unit 31. The projections 4A11 (FIGS. 15 and 17) of the holder piece 4A contact with the lateral side of the heat-receiving block 325, so that the heat-receiving block 325 is positioned within the openings 41, 42 by the holder piece 4A.

As shown in FIGS. 22 and 23, discharge ports 327, 328 for discharging the air sucked within the housing 322 are provided on adjoining two sides among the four sides of the housing 322 except for the lower side 323 and the upper side 324.

The discharge port 327 is connected to the air outlets 2221, 2222 provided on the lateral side 222 of the lower casing 22, and the air after cooling the heat-radiation fin 3245 is discharged through the air outlets 2221, 2222. Around the discharge port 327, more specifically on the lower side and lateral side of the housing 322 defining the discharge port 327, a sponge 3271 to be in contact with the contact portion 2265 provided on the lower casing 22 is provided. The sponge 3271 connects the discharge port 327 with the air outlet 2222 (FIG. 1), so that the cooling air after cooling the device body 3 within the exterior casing 2 to be discharged from the discharge port 327 is discharged through the air outlets 2221, 2222 without leakage.

The discharge port 328 is connected with the air outlets 2248 provided on the lower casing 22. The air after cooling the heat-radiation fin 3246 is discharged through the air outlet 2248. A sponge 3281 is provided around the discharge port 328, more specifically on the upper side (the side shown in FIG. 23) and the lateral side of the housing 322 defining the discharge port 328. The sponge 3281 and the sponge 2264 (FIG. 6) provided on the lower casing 22 connect the discharge port 328 with the air outlet 2248 (FIG. 3) provided on the lower casing 22, so that the cooling air discharged from the discharge port 328 can be discharged to the outside of the exterior casing 2 through the air outlet 2248 without leakage.

When the information processing device 1 is horizontally laid, the cooling unit 32 discharges the cooling air after cooling the interior thereof toward the lateral side (toward the surface 2A (FIG. 1)) and the rear side. In contrast, when vertically placed, the cooling air is discharged to the upper and rear side.

The upper side 324 has total four positioning pins 329 projecting in an out-plane direction from the upper side 324. Two of the positioning pins 329 project around the discharge port 327 of the plate member 3241 and the other two project around the discharge port 328 of the plate member 3242. The positioning pins 329 are inserted into the pin insertion holes 401 provided on the main-frame 4 when the main-frame 4 is positioned relative to the cooling unit 32 while the upper side 324 of the cooling unit 32 is opposed to the lower side of the main-frame 4.

(6) Arrangement of Plate Spring 36

Next, the arrangement of the plate spring 36 will be described below.

Figure 24:
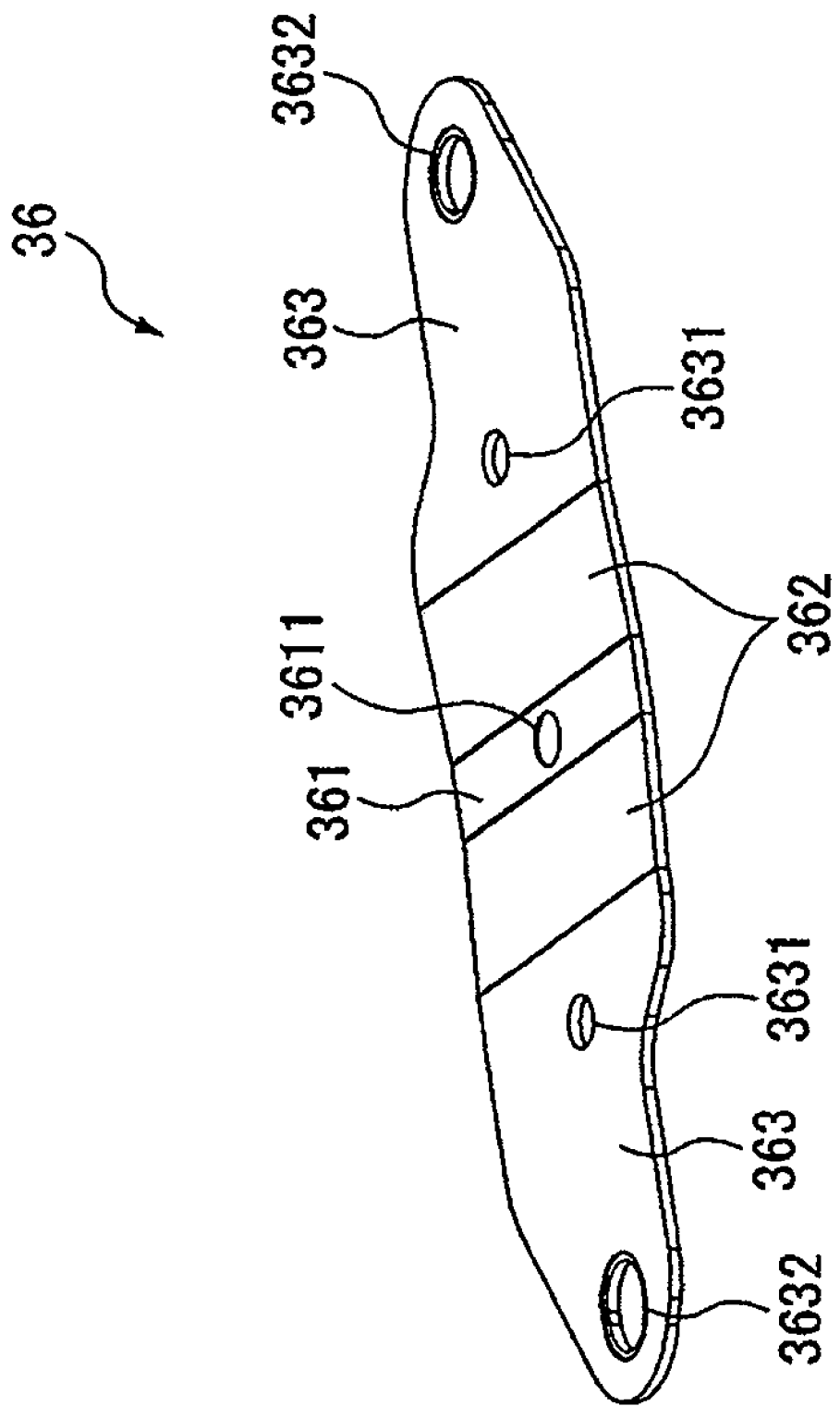
FIG. 24 is a perspective view showing an upper side of a plate spring of the embodiment.
Figure 25:
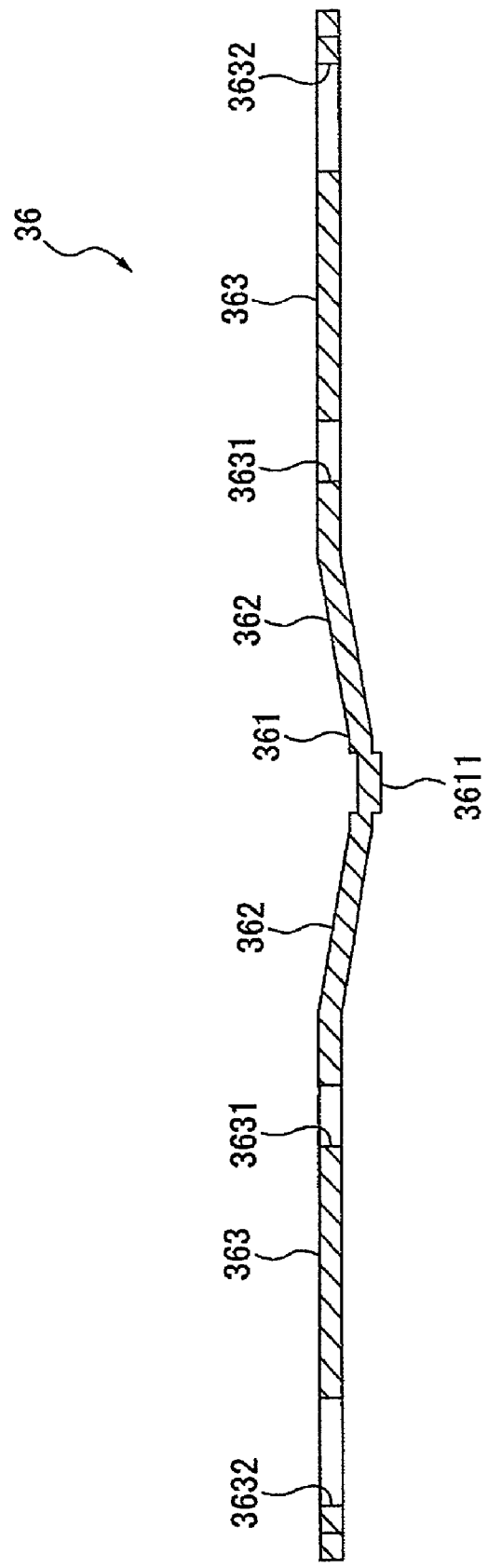
FIG. 25 is a cross section showing the plate spring of the embodiment.

FIG. 24 is a perspective view showing an upper side of the plate spring 36. FIG. 25 is a cross section showing the plate spring 36.

As described above, the two plate springs 36 are components for attaching the cooling unit 32 to the control unit 31, which correspond to a biasing plate of the present invention for biasing the cooling unit 32 in a direction for the cooling unit 32 to be pressed onto the CPU 51 and the GPU 52 (the object to be cooled). As shown in FIG. 24, the plate spring 36 has an approximately point-symmetrical oblong configuration (in plan view). Specifically, the plate springs 36 have a shape corresponding to the openings 61 and 62 of the sub-frame 6, which are respectively fitted into the openings 61, 62.

As shown in FIGS. 24 and 25, the plate spring 36 has a narrow flat portion 361 approximately at the center thereof. The flat portion 361 has a projection 3611 projecting toward the sub-frame 6 to be in contact with the approximate center of the upper side of the plate bodies 63, 64 approximately at the center thereof. The flat portion 361 has a pair of upwardly inclined sections 362 on both sides thereof. Further, the plate spring 36 has flat portions 363 approximately in parallel with the flat portion 361 on both sides of the pair of inclined sections 362.

The flat portions 363 are respectively provided thereon with two holes 3631, 3632.

The hole 3631 provided on the inner side relative to the hole 3632 is located at a position corresponding to the projections 631, 641 exposed on the upper side of the plate bodies 63, 64 when the plate spring 36 is in contact with the plate bodies 63, 64.

The holes 3632 provided on both ends of the plate spring 36 receives the screws 37 (FIG. 12) to be screwed into the threaded holes 32521 (FIG. 23) provided on the heat-receiving block 325.

When the screw 37 is inserted into the hole 3632 to be screwed into the threaded hole 32521 of the cooling unit 32, the respective flat portions 363 of the plate spring 36 is pushed downward (toward the sub-frame 6). Since the pair of inclined sections 362 located inside the flat portion 363 are inclined relative to the flat portion 363, the flat portion 361 between the pair of inclined sections 362 are pushed downward. At this time, the projection 3611 is in contact with the plate bodies 63, 64 of the sub-frame 6 to apply a load onto the plate bodies 63, 64 at a single point. On account of the load applied by the plate spring 36, the CPU 51 and GPU 52 are respectively pressed toward the heat-receiving blocks 325C, 325G through the plate bodies 63, 64 and, at the same time, the cooling unit 32 is pulled toward the control unit 31. Accordingly, the CPU 51 and the GPU 52 can be securely pressed toward the heat-receiving blocks 325C, 325G, so that the heat transfer efficiency from the CPU 51 to the GPU 52 to the heat-receiving blocks 325C, 325G can be enhanced.

(7) Assembling Process of Control Unit 31

Assembling process of the control unit 31 will be described below.

The control unit 31 is assembled on the cooling unit 32. Specifically, in order to assemble the control unit 31, the positioning pin 329 (FIG. 23) provided on the cooling unit 32 is inserted into the pin insertion hole 401 (FIG. 13) provided on the main-frame 4 to position the main-frame 4 relative to the cooling unit 32.

Subsequently, the terminal 59 (FIG. 19) provided on the control board 5 is inserted into the openings 441 to 444 (FIG. 13) provided on the main-frame 4 to mount the control board 5 onto the main-frame 4 to cover the main-frame 4 with the control board 5. At this time, the control board 5 is positioned against the main-frame 4 so that the notches 56R and 56L (FIG. 18) are disposed inside the rising portions 47R and 47L (FIG. 13) and the holes 55R and 55L (FIG. 18) receive the pins 46R and 46L (FIG. 13). Accordingly, the control board 5 can be positioned at an appropriate location relative to the main-frame 4.

Subsequently, the sub-frame 6 is attached to the main-frame 4 on which the control board 5 is mounted. At this time, after inserting the rising portion 65 (FIG. 20) into the openings 445 to 447 (FIG. 13) and the opening 451 (FIG. 13), the sub-frame 6 is turned to cover the main-frame 4 and the control board 5. At this time, in the same manner as the control board 5, the sub-frame 6 is positioned against the main-frame 4 so that the notches 67R, 67L (FIG. 20) are disposed inside the rising portions 47R, 47L (FIG. 13) and the holes 66R, 66L (FIG. 20) receive the pins 46R, 46L (FIG. 13) on the main-frame 4. Accordingly, the sub-frame 6 can be positioned at an appropriate location relative to the main-frame 4.

Subsequently, the main-frame 4 and the sub-frame 6 are fixed by a screw inserted through a hole (not shown) provided on the outer circumference of the main-frame 4 and the sub-frame 6 to assemble the control unit 31.

(8) Attachment of Cooling Unit 32 to Control Unit 31

Next, attachment process of cooling unit 32 to the control unit 31 will be described below.

FIG. 25 is a cross section showing the respective components 4 to 6 of the control unit 31 and the cooling unit 32. FIG. 27 is a cross section showing the control unit 31 and the cooling unit 32 when the cooling unit 32 is attached to the control unit 31. Incidentally, FIG. 26 is a cross section of the control board 5 taken at the position of the CPU 51 of the control board 5, where components corresponding to the similarly-arranged GPU 52 are referenced in parenthesis.

As described above, the cooling unit 32 is pressed and fixed onto the control unit 31 by the plate spring 36 and the screw 37. How the cooling unit 32 is attached will be described below.

Figure 26:
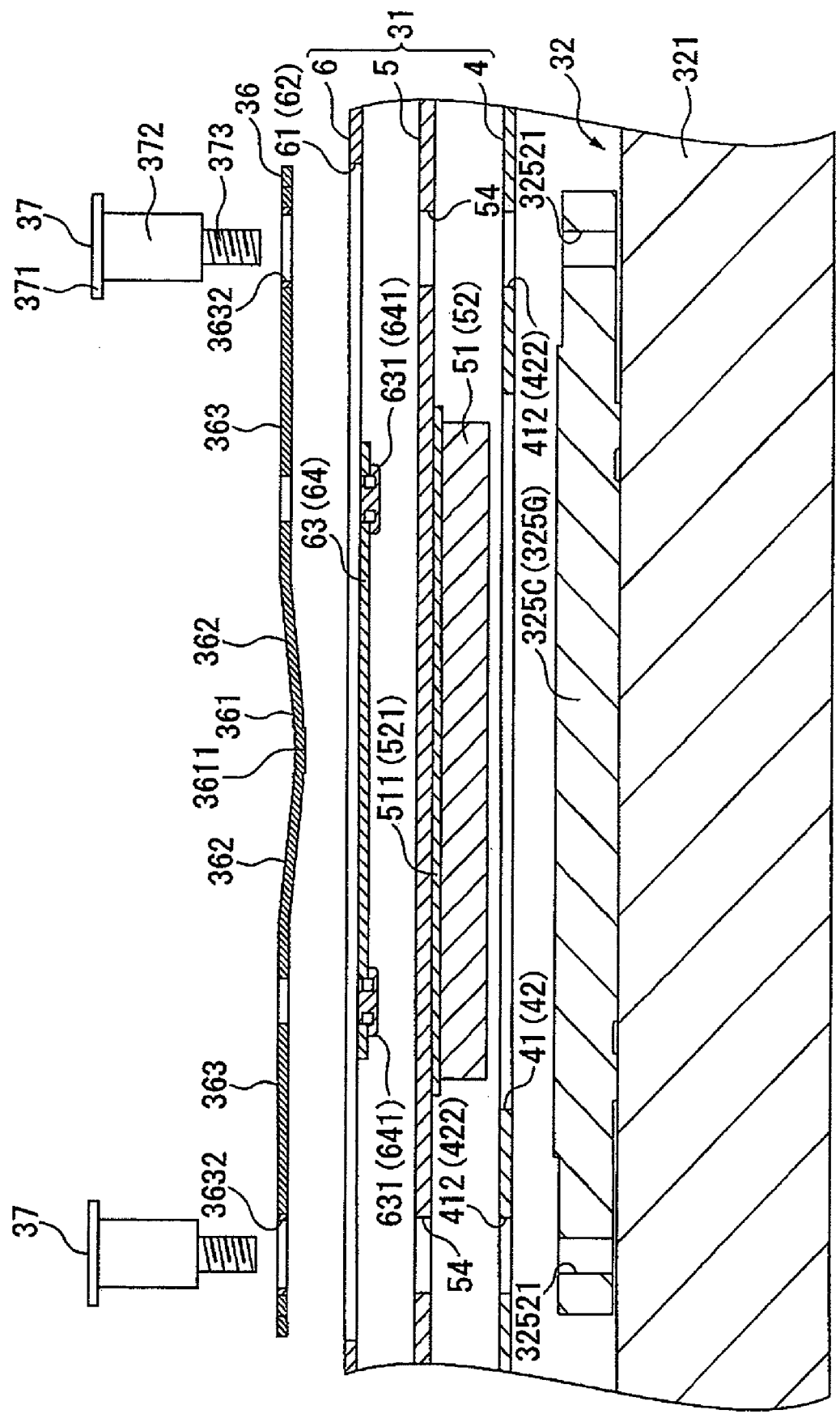
FIG. 26 is a cross section showing the control unit and the cooling unit of the embodiment.
Figure 27:
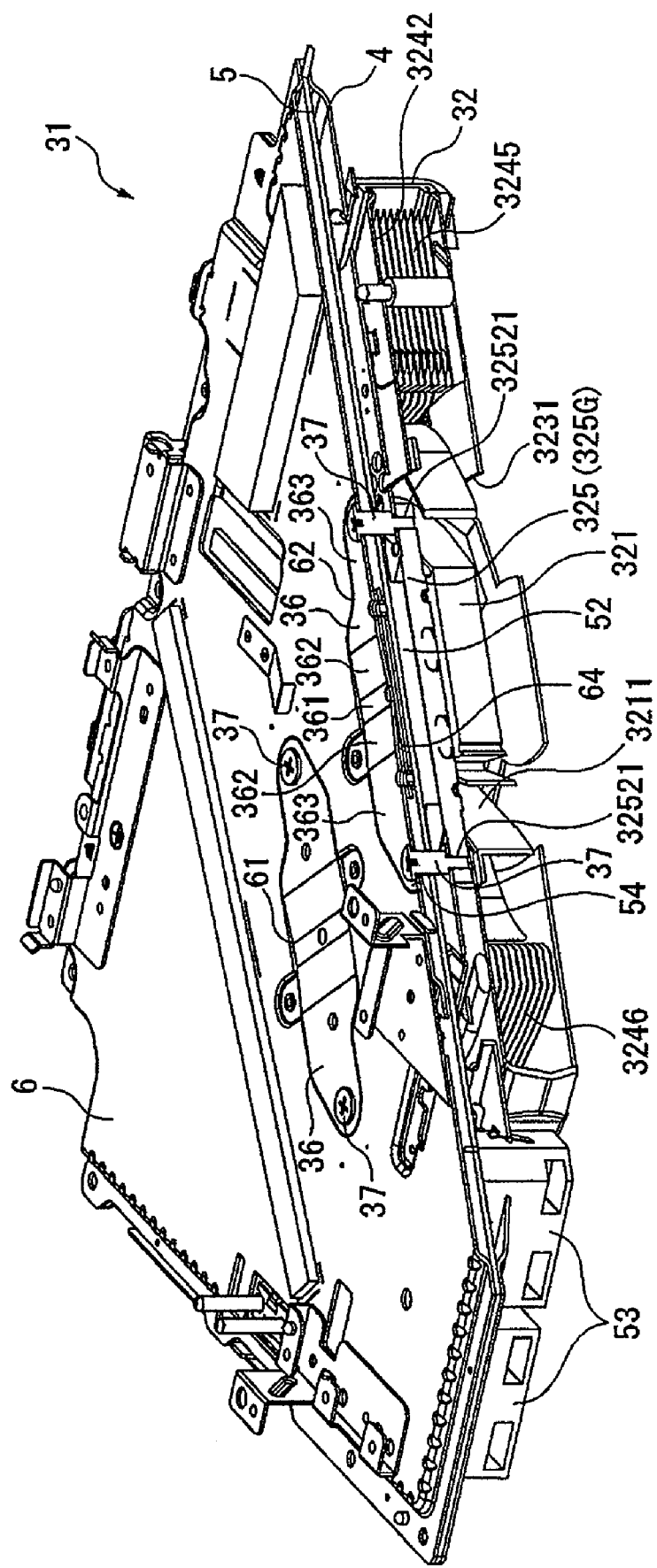
FIG. 27 is a cross section showing the control unit and the cooling unit of the embodiment.

As shown in FIGS. 26 and 27, when the control unit 31 is assembled on the cooling unit 32, the cooling unit 32 and the main-frame 4 are positioned with the use of the positioning pin 329 (FIG. 23) and the pin insertion hole 401 (FIG. 14) so that the CPU 51 and the GPU 52 (only the GPU 52 is shown in FIG. 27) exposed through the openings 41, 42 are mutually in contact with the heat-receiving blocks 325C, 325G of the cooling unit 32 (only the heat-receiving block 325G is shown in FIG. 27). In this state, the plate springs 36 are respectively aligned with the openings 61, 62. At this time, the respective plate springs 36 are disposed so that the projections 3611 of the flat portions 361 provided approximately at the center of the respective plate springs 36 are in contact with the plate bodies 63, 64 provided to cover the approximate center of the openings 61/62 and the inclined sections 362 stretching from the both ends of the flat portion 361 extend away from the sub-frame 6.

Subsequently, the screw 37 is inserted into the holes 3632 (FIG. 26), the openings 61, 62, the hole 54 and the holes 412, 422. Then, the screw 37 is screwed into the threaded hole 32521 and the plate spring 36 is screwed and fixed onto the cooling unit 32. At this time, the inclined sections 362 and the flat portions 363 are bent toward the control board 5, so that the flat portions 363 bias the cooling unit 32 toward the control units 31 through the screws 37 and the projections 3611 press the CPU 51 and the GPU 52 toward the heat-receiving blocks 325C, 325G.

At this time, the plate spring 36 are in contact with the plate bodies 63, 64 at a single point on the projection 3611, where the plate spring 36 is fixed so that 10 kg load is applied on the plate bodies 63, 64 by the projection 3611. Accordingly, the 10 kg load applied on the plate bodies 63, 64 are evenly applied onto the control board 5 from the projections 631 and 641 provided on four corners of the plate bodies 63, 64.

Further, the plate bodies 63, 64 are sized approximately identically with the CPU 51 and the GPU 52 and are located at a position corresponding to the CPU 51 and the GPU 52. Accordingly, the loads applied from the projections 631, 641 provided on the four corners of the plate bodies 63, 64 evenly brings the four corners of the CPU 51 and the GPU 52 into tight contact with the heat-receiving blocks 325C, 325G. As a result, the displacement (e.g. distortion) of the terminals provided on the CPU 51 and the GPU 52 to be inserted into the sockets 511, 521 can be restrained, and the CPU 51 and the GPU 52 can be securely and appropriately pressed onto the heat-receiving blocks 325C, 325G.

With regard to the screw 37, the screw 37 is configured to have a thin insertion tip end and thick base end in inserting direction as shown in FIG. 26.

More specifically, the screw 37 is provided with an approximately circular (in plan view) screw head 371, a cylindrical section 372 projecting from the screw head 371 in an out-plane direction and a threading portion 373 projecting further from the tip end of the cylindrical section 372 and having an outer diameter smaller than the cylindrical section 372.

The outer dimension of the screw head 371 is greater than the inner dimension of the hole 3632 and the outer diameter of the cylindrical section 372 is slightly smaller than the holes 3632, 54, 412 and 422 respectively provided on the plate spring 36, the control board 5 and the main-frame 4. Further, the outer diameter of the threading portion 373 is slightly smaller than the inner diameter of the threaded hole 32521 and the threading portion 373 is provided with a thread groove on the outer circumference thereof.

When the screw 37 is screwed with into the threaded hole 32521, the tightening force of the screw 37 to the threaded hole 32521 is not transmitted to the sub-frame 6, the control board 5 and the main-frame 4. The pressing of the CPU 51 and the GPU 52 onto the heat-receiving blocks 325C, 325G is effected by pulling the cooling unit 32 by the deformation of the plate spring 36 and pressing the CPU 51 and the GPU 52 toward the heat-receiving block 325 transmitted through the plate bodies 63, 64. Accordingly, deformation such as curve of the control board 5 by attaching the screw 37 onto the heat-receiving block 325 can be restrained.

FIG. 28 is a perspective view showing the heat-receiving block 325 held by the holder piece 4A attached to the extension 411.

When the CPU 51 and the GPU 52 are pressed onto the heat-receiving blocks 325C, 325G, the heat-receiving blocks 325C, 325G (only the heat-receiving block 325C is shown in FIG. 28) is held by the pair of holder pieces 4A as shown in FIG. 28. Accordingly, the heat-receiving blocks 325C, 325G can be securely located within the openings 41, 42, thereby ensuring the contact of the heat-receiving blocks 325C, 325G to be securely in contact with the CPU 51 and the GPU 52 exposed through the openings 41, 42 toward the cooling unit 32. Further, since the holder piece 4A is made of heat-conductive metal, the heat transferred to the heat-receiving block 325 can be further transferred to and radiated at the main-frame 4. Since the CPU 51, the GPU 52 and the main-frame 4 are electrically coupled through the heat-receiving blocks 325C, 325G and the holder piece 4A as described above, EMI can be effectively avoided.

According to the above arrangement, the heat-receiving block 325 can be pressed onto the CPU 51/the GPU 52. Further, the CPU 51 and the GPU 52 can be pressed onto the heat-receiving blocks 325C, 325G through the plate bodies 63, 64. Consequently, the heat generated on the CPU 51 and the GPU 52 can be rapidly transferred to the heat-receiving blocks 325C, 325G. The heat transferred to the heat-receiving blocks 325C, 325G are transferred by the heat pipes 326C, 326G (FIG. 23) to the heat-radiation fins 3246, 3245 through the plate members 3241, 3242 (only the plate member 3241 is shown in FIG. 27). The cooling air is delivered to the heat-radiation fins 3245, 3246 in accordance with the rotation of the rotary shaft and the vane 3211 of the air blower 321, the cooling air cooling the heat of the CPU 51 and the GPU 52 transferred to the heat-radiation fins 3245, 3246.

The air after cooling the heat-radiation fin 3245 is discharged to the outside of the exterior casing 2 from the air outlets 2221, 2222 through the discharge port 327. The air after cooling the heat-radiation fin 3246 is discharged to the outside of the exterior casing 2 from the air outlet 2248 through the discharge port 328.

(9) Effect of Embodiment

According to the information processing device 1 of the present embodiment, following advantages can be obtained.

The cooling unit 32 with the heat-receiving block 325C, 325G to be in contact with the CPU 51 and the GPU 52 disposed on the control board 5 is biased toward the control board 5 by the plate spring 36 provided on a side opposite to the cooling unit 32 relative to the control board 5. The heat-receiving blocks 325C, 325G are pulled by the plate spring 36 to be pressed onto the CPU 51 and the GPU 52 (articles to be cooled), so that the heat generated on the CPU 51 and the GPU 52 is transferred to the heat-receiving blocks 325C, 325G to be cooled by the cooling air delivered by the air blower 321.

According to the above arrangement, the cooling unit 32 can be biased toward the control board 5 by the plate spring 36 attached to the heat-receiving block 325, so that the heat-receiving blocks 325C, 325G can be pressed onto the CPU 51 and GPU 52. Thus, the heat-receiving blocks 325C, 325G are more closely in contact with the CPU 51 and the GPU 52, thereby efficiently transferring the heat generated by the CPU 51 and the GPU 52 to the heat-receiving blocks 325C, 325G. Further, in addition to the enhancement of the heat-transfer efficiency of the CPU 51 and the GPU 52, the heat transferred to the heat-receiving blocks 325C, 325G can be transferred to the plate members 3241, 3242 and the heat-radiation fins 3246, 3245 through the heat pipes 326C, 326G.

Consequently, since the heat-radiation area can be enlarged, the CPU 51 and the GPU 52 can be efficiently and rapidly cooled.

Since the control board 5 is held by the cooling unit 32 and the plate spring 36 and the CPU 51 and the GPU 52 are pressed onto the heat-receiving blocks 325C, 325G of the cooling unit 32, the cooling unit 32 can be stably mounted.

When the cooling unit 32 is fixed onto the control board 5 with a screw and the like in order to press the heat-receiving blocks 325C, 325G onto the CPU 51 and the GPU 52, since unidirectional load is applied onto the control board 5 in tightening the screw and the like, the control board 5 may be deformed (e.g. warped). In contrast, since the control board 5 of the information processing device 1 of the present embodiment is held by the cooling unit 32 and the plate spring 36 attached onto the cooling unit 32 with a screw 37, bidirectional load (i.e. from the plate spring 36 and from the cooling unit 32) can be applied onto the control board 5. Accordingly, the deformation of the CPU 51 and the GPU 52 and, consequently, the control board 5 can be restrained.

Further, the heat-receiving blocks 325C, 325G are in contact with the CPU 51 and the GPU 52 (integrated circuits) disposed on the control board 5. Since the heat generated on the CPU 51 and the CPU 52 can be transferred to the heat-receiving blocks 325C, 325G, the temperature of the CPU 51 and the GPU 52 can be lowered. Accordingly, thermal runaway of the CPU 51 and the GPU 52 can be prevented, so that the information processing by the information processing device 1 can be smoothly conducted.

Further, since the plate spring 36 is disposed on a side of the control board 5 opposite to the mount side of the casings of the CPU 51 and the GPU 52, the casing (heat-generating part) of the CPU 51 and the GPU 52 can be brought into contact with the heat-receiving blocks 325C, 325G. Accordingly, since the heat can be transferred from the casings of the CPU 51 and the GPU 52, the cooling efficiency of the CPU 51 and the GPU 52 can be further improved. In addition, since the plate spring 36 pulls the cooling unit 32 to be pressed toward the CPU 51 and the GPU 52 sandwiching the control board 5, the control board 5 can be prevented from being warped even when a relatively large-size cooling unit 32 is used.

The control board 5 is covered with the main-frame 4 and the sub-frame 6. As a result, leakage of unnecessary radiation noise generated by the control board 5 (circuit board including the CPU 51 and the GPU 52) can be prevented, thereby restraining EMI.

Further, the control board 5 is disposed within a space defined by the recesses 40 and 60 provided at the center of the main-frame 4 and the sub-frame 6. Accordingly, the dimension of the main-frame 4 and the sub-frame 6 covering the control board 5 can be minimized. As a result, the size and thickness of the control unit 31 constructed by the main-frame 4, the control board 5 and the sub-frame 6 can be reduced.

The screw 37 for attaching the plate spring 36 located at a position corresponding to the CPU 51 of the control board 5 is inserted through the hole 3621 of the plate spring 36, the opening 61 of the sub-frame 6, the hole 54 of the control board 5 and the hole 412 of the main-frame 4 to be secured into the hole 32521 provided on the heat-receiving block 325C of the cooling unit 32.

In the above, the tightening force of the screw 37 to the threaded hole 32521 is not applied on the control unit 31. Accordingly, displacement on the control unit 31, especially on the control board 5, can be further securely restrained. Incidentally, the same effect and advantage can be achieved by the plate spring 36 located at a position corresponding to the GPU 52.

A plate body 63 that covers approximate center of the opening 61 of the sub-frame 6 is interposed between the control board 5 and the plate spring 36. The plate body 63 is configured in a shape corresponding to the CPU 51 and is located at a position corresponding to the CPU 51. Projections 631 are respectively provided on the four corners of the plate body 63 on a side facing the control board 5. A single projection 3611 that is in contact with approximate center of the plate body 63 is provided on the plate spring 36 at a side facing the plate body 63.

Accordingly, when the plate spring 36 is attached to the cooling unit 32 via the control unit 31, the pressing force of the control unit 31 toward the cooling unit 32 applied by the plate spring 36 is transmitted to the plate body 63 at a single point on the projection 3611. The pressing force is evenly distributed to the projections 631 provided on the four corners of the plate body 63 and the control board 5 is pressed by the projections 631. Since the plate body 63 has a shape corresponding to the CPU 51, the respective projections 631 press the four corners of the CPU 51 toward the heat-receiving block 325C, so that the CPU 51 can be more closely contacted with the heat-receiving block 325C.

Further, since the pressing force can be evenly applied on the four corners of the CPU 51, the displacement of the CPU 51 caused when the pressing force is unevenly applied on the CPU 51, e.g. the displacement of the terminal provided on the CPU 51 to be attached to the socket 511, can be avoided.

Incidentally, the same effect and advantage can be achieved by the plate spring 36 and the plate body 64 located at a position corresponding to the GPU 52.

Further, since the projections 631 and 641 are made of insulative material, transmission of the electric current flowing through the control board 5 to the plate spring 36 through the plate bodies 63, 64 can be prevented. Accordingly, noise-mixture on the electric current flowing through the control board 5 and errors on the signal flowing into/out of the control board 5 can be prevented.

The plate spring 36 is attached to the cooling unit 32 by the screw 37 so that 10 kg load is applied respectively on the plate bodies 63, 64. Accordingly, the CPU 51 and GPU 52 can be closely attached on the heat-receiving blocks 325C, 325G. Since the heat-receiving blocks 325C, 325G can be further closely attached onto the CPU 51 and the GPU 52, the heat can be further smoothly transferred from the CPU 51 and the CPU 52, thus enhancing the cooling efficiency of the CPU 51 and the GPU 52.

A pair of holder pieces 4A for respectively holding the heat-receiving blocks 325C, 325G when the CPU 51 and the GPU 52 exposed from the openings 41, 42 abut to the heat-receiving blocks 325C, 325G are provided on the pair of extensions 411 and 422 formed on the periphery of the openings 41, 42 of the main-frame 4. Since the holder pieces 4A hold the heat-receiving blocks 325C, 325G, the heat-receiving blocks 325C, 325G can be more accurately positioned relative to the CPU 51 and the GPU 52. Accordingly, the heat-receiving blocks 325C, 325G can be securely brought into contact respectively with the CPU 51 and the GPU 52 and the cooling efficiency of the CPU 51 and the GPU 52 can be further enhanced.

Further, since the holder piece 4A is made of heat-conductive metal, the heat transferred to the heat-receiving blocks 325C, 325G can be transferred to and radiated by the main-frame 4 to be radiated. Accordingly, additional number of heat-transfer channel can be provided for the CPU 51 and the GPU 52, thereby further enhancing the cooling efficiency of the CPU 51 and the GPU 52.

In addition, since the holder pieces 4A hold the heat-receiving blocks 325C, 325G when the heat-receiving blocks 325C, 325G are in contact with the CPU 51 and the GPU 52, the CPU 52 and the GPU 52 are electrically coupled with the main-frame 4 through the heat-receiving blocks 325C, 325G and the holder pieces 4A both of made of metal. Accordingly, unnecessary radiation noise generated by the control board 5 can be transmitted to the main-frame 4, thus providing further secure EMI countermeasure on the information processing device 1.

The cooling unit 32 includes the heat-receiving blocks 325C, 325G to which the heat from the CPU 51 and the GPU 52 is transferred and the air blower 321 for delivering the cooling air to the heat-radiation fins 3246, 3245 to which the heat is transferred from the heat-receiving blocks 325 through the heat pipe 326 and the plate bodies 3241, 3242. Since the heat transferred to the heat-receiving blocks 325C, 325G can be forcibly cooled by the cooling air from the air blower 321, the cooling efficiency of the heat-receiving blocks 325C, 325G can be improved as compared with an arrangement where the heat-receiving blocks 325C, 325G are cooled by natural loss of the transferred heat. Accordingly, the cooling efficiency of the CPU 51 and the GPU 52, i.e. the heat-source of the heat transferred to the heat-receiving blocks 325C, 325G, can be further enhanced.

(10) Modifications

Though best mode for carrying out of the present invention has been described in the above, the scope of the present invention is not limited thereto. Specifically, the above description regarding configuration, material and the like of the components are exemplified only for the purpose of assisting the understanding of the present invention and does not serve for any limitative purposes, so that the components named without reference to a part of or the entirety of the configuration, material and the like are also within the scope of the present invention.

Though the CPU 51 and GPU 52 of the control board 5 are cooled by the cooling unit 32 in the above embodiment, other arrangement is possible for implementing the present invention. For instance, the other integrated circuits mounted on the control board 5 may abut to the heat-receiving block 325 to transfer the heat to the heat-receiving block 325. The above integrated circuit may be a chipset and the like. Other electronic components may be cooled instead of the integrated circuits.

Though the plate spring 36 is provided on the side of the control board 5 on which the terminals of the CPU 51 and the GPU 52 are exposed in the above embodiment, the plate spring 36 may be provided on a side on which the casings of the CPU 51 and the GPU 52 are provided. In the above arrangement, the heat-receiving blocks 325C, 325G are provided on the terminal-side of the CPU 51 and the GPU 52, so that a heat-conductive and insulative component may preferably be provided between the CPU 51/GPU 52 and the heat-receiving block 325. Accordingly, while allowing the heat generated by the CPU 51 and the GPU 52 to be transferred from the terminal to the heat-receiving block 325 through the component, the electric current flowing through the terminal can be prevented from being transmitted to the heat-receiving block 325.

Though the control board 5 is housed within the space defined by the recess 40 of the main-frame 4 and the recess 60 of the sub-frame 6, and the plate spring 36 is disposed within the openings 61, 62 provided on the sub-frame 6 in the above embodiment, other arrangement is possible in the present invention. Specifically, the main-frame 4 and the sub-frame 6 may not be provided. In the above arrangement, since the plate spring 36 is directly in contact with the control board 5 at a position corresponding to the CPU 51 and the GPU 52, a separate insulative component is preferably interposed between the plate spring 36 and the control board 5 when the plate spring 36 is made of metal.

In the above embodiment, the plate bodies 63, 64 are interposed between the control board 5 and the plate spring 36: the projections 631, 641 to be in contact with the mount position of the CPU 51 and the GPU 52 of the control board 5 are provided on the four corners of the plate bodies 63, 64; and the projections 3611 projecting in an out-plane direction to be in contact approximately at the center of the plate bodies 63, 64 are provided on the side of the plate spring 36 facing the plate bodies 63, 64. However, other arrangement may be employed. For instance, a plurality of projections 3611 may be provided on the plate spring 36, where the number of the projections 631 and 641 provided on the plate bodies 63, 64 may be determined as desired.

Though the cooling unit 32 is pulled to press the heat-receiving block 325 of the cooling unit 32 toward the CPU 51 and the GPU 52 by a 10 kg load in the above embodiment, other arrangement is possible. Specifically, the applied load may be determined in accordance with the arrangement of the cooling unit 32 and the article to be cooled.

Though the cooling unit 32 includes the heat-receiving blocks 325C, 325G to which the heat is transferred from the CPU 51 and the GPU 52 (article to be cooled) and the air blower 321 for delivering cooling air to the heat-receiving blocks 325C, 325G, the plate bodies 3241, 3242 and the heat-radiation fins 3246, 3245 in the above embodiment, other arrangement is possible. For instance, a separate fan may be provided as an air blower.

What is claimed is:

1. An information processing device, comprising:
   an object to be cooled, the object being a heat generating body and being provided on one side of a circuit board;
   a cooling unit that is in contact with a first side of the object and radiates the heat transferred from the object;
   a biasing plate provided at a second side of the object opposite to the first side and attached to the cooling unit, the biasing plate being provided at the other side of the circuit board opposite to the one side;
   a plate body disposed between the biasing plate and the circuit board, the plate body having a dimension corresponding to the object and having a rigidity,
   the biasing plate being disposed at a position corresponding to the plate body and biasing the cooling unit in a direction for the cooling unit to be pressed onto the object,
   the plate body having protrusions that are in contact with the circuit board and respectively provided at corners of a side opposing to the circuit board, the protrusions distributing a biasing force of the biasing plate and applying the distributed biasing force to the circuit board;
   a pair of metal frame members having recesses that are respectively provided on the pair of frame members and recessed away from the circuit board for accommodating the circuit board; and
   a stopper for fixing the biasing plate to the cooling unit,
   the biasing plate having a first hole for the stopper to be inserted,
   the pair of frame members including a first frame member provided at the other side of the circuit board and a second frame member provided at the one side of the circuit board,
   the first frame member having a first opening for receiving the biasing plate at a position corresponding to the object,
   the circuit board having a second hole for the stopper to be inserted,
   the second frame member having a third hole for the stopper to be inserted and a second opening for receiving the object,
   the cooling unit having an engaging portion for engaging the stopper.

2. The information processing device according to claim 1, wherein the object is an integrated circuit performing a predetermined arithmetic processing of a control process of the information processing device.

3. The information processing device according to claim 1, wherein the biasing plate has a projection projecting in an out-plane direction to be in contact with approximately the center of the plate body on a side opposing to the plate body.

4. The information processing device according to claim 1, wherein the protrusions are made of insulative material.

5. The information processing device according to claim 1, wherein the biasing plate is attached to the plate body so as to apply a load of approximately ten kilograms.

6. The information processing device according to claim 1, further comprising: a pair of holding pieces provided around the second opening, the pair of holding pieces holding the cooling unit when the cooling unit is in contact with the object.

7. The information processing device according to claim 1, the cooling unit comprising:
   a heat-receiving portion that is in contact with the object, the heat from the object being transferred to the heat-receiving portion; and
   an air blower that blows a cooling air to the heat-receiving portion to cool the heat-receiving portion.

* * * * *